(12) United States Patent
Kuramoto

(10) Patent No.: US 7,653,105 B2
(45) Date of Patent: Jan. 26, 2010

(54) SEMICONDUCTOR LASER, METHOD OF MANUFACTURING SEMICONDUCTOR LASER, OPTICAL PICKUP AND OPTICAL DISK SYSTEM

(75) Inventor: Masaru Kuramoto, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/936,431

(22) Filed: Nov. 7, 2007

(65) Prior Publication Data

US 2008/0117945 A1 May 22, 2008

(30) Foreign Application Priority Data

Nov. 9, 2006 (JP) ............... 2006-303672

(51) Int. Cl.
*H01S 5/00* (2006.01)

(52) U.S. Cl. ............... 372/45.012; 372/44.01; 372/43.01

(58) Field of Classification Search ............ 372/45.012, 372/44.01, 43.01
See application file for complete search history.

(56) References Cited

U.S. PATENT DOCUMENTS

| 6,100,174 | A | 8/2000 | Takatani |
| 6,784,010 | B2 | 8/2004 | Yamaguchi et al. |
| 6,870,193 | B2 | 3/2005 | Takeya et al. |
| 2003/0136970 | A1* | 7/2003 | Takeya et al. ............ 257/90 |
| 2005/0175053 | A1* | 8/2005 | Kimura et al. ............ 372/50.12 |

FOREIGN PATENT DOCUMENTS

| JP | 09-191160 | 7/1997 |
| JP | 10-041254 | 2/1998 |
| JP | 10-303504 | 11/1998 |
| JP | 2002-076521 | 3/2002 |
| JP | 2002-335048 | 11/2002 |
| JP | 2003-031898 | 1/2003 |
| JP | 2003-218458 | 7/2003 |
| JP | 2003-289176 | 10/2003 |

OTHER PUBLICATIONS

T. Ohno et al.; Self-pulsation in InGaN laser diodes with saturable absorber layers; Applied Physics Letters; vol. 83, No. 6; Aug. 11, 2003.
Kiyoshi Takahashi; Wide-gap semiconductor Opto and electronic device; Morikita Publishing Col., Ltd.; 2006; pp. 203-213.
Japanese Office Action dated Jun. 17, 2008 for Application No. 2006-303672.

* cited by examiner

*Primary Examiner*—Minsun Harvey
*Assistant Examiner*—Kinam Park
(74) *Attorney, Agent, or Firm*—Sonnenschein Nath & Rosenthal LLP

(57) ABSTRACT

A semiconductor laser using a nitride type Group III-V compound semiconductor includes: an n-side clad layer; an n-side optical waveguide layer over the n-side clad layer; an active layer over the n-side optical waveguide layer; a p-side optical waveguide layer over the active layer; an electron barrier layer over the p-side optical waveguide layer; and a p-side clad layer over the electron barrier layer. A ridge stripe is formed at an upper part of the p-side optical waveguide layer, the electron barrier layer and the p-side clad layer, and the distance between the electron barrier layer and a bottom surface in areas on both sides of the ridge stripe is not less than 10 nm.

8 Claims, 15 Drawing Sheets

SEMICONDUCTOR LASER, METHOD OF MANUFACTURING SEMICONDUCTOR LASER, OPTICAL PICKUP AND OPTICAL DISK SYSTEM

CROSS REFERENCES TO RELATED APPLICATIONS

The present invention contains subject matter related to Japanese Patent Application JP 2006-303672 filed with the Japan Patent Office on Nov. 9, 2006, the entire contents of which being incorporated herein by reference.

BACKGROUND OF THE INVENTION

1. Field of the Invention

The present invention relates to a semiconductor laser, a method of manufacturing a semiconductor laser, an optical pickup and an optical disk system, and particularly to those suitable for application to a ridge stripe type semiconductor laser using a nitride type Group III-V compound semiconductor, and an optical pickup and an optical disk system which each use the ridge stripe type semiconductor laser as a light source.

2. Description of the Related Art

In high-density optical disk systems, a GaN semiconductor laser with an emission wavelength in a 400 nm band is used as a light source. FIG. 13 shows an example of such a GaN semiconductor laser in the related art (refer to, for example, Kiyoshi Takahashi (general editorship), Widegap Semiconductor Opto-electronic Devices, Morikita Publishing Co., Ltd. (2006), pp. 203 to 213 as Non-patent Document 1 and Japanese Patent Laid-open No. 2003-289176 as Patent Document 1). As shown in FIG. 13, in the GaN semiconductor laser, following layers are sequentially stacked over an n-type GaN substrate 101. Concretely, an n-type AlGaN clad layer 102, an n-type GaN optical waveguide layer 103, an active layer 104 of an undoped $Ga_{1-x}In_xN$ (quantum well layer)/$Ga_{1-y}In_yN$ (barrier layer, x>y) multiple quantum well structure, an undoped InGaN optical waveguide layer 105, an undoped AlGaN optical waveguide layer 106, a p-type AlGaN electron barrier layer 107, a p-type GaN/undoped AlGaN superlattice clad layer 108 and a p-type GaN contact layer 109. An upper part of the p-type GaN/undoped AlGaN superlattice clad layer 108 and the p-type GaN contact layer 109 are provided with ridge stripes 110 extending rectilinearly in one direction (resonator length direction). An SiO2 film 111 and an undoped Si film 112 thereon are formed to extend on the p-type GaN/undoped AlGaN superlattice clad layer 108 on both side surfaces of the ridge stripe 110 and in areas on the other sides thereof. A p-side electrode 113 is formed in ohmic contact with the p-type GaN contact layer 109 at the ridge stripe 110. The p-side electrode 113 is formed to extend on the undoped Si film 112, and to extend over the range from one resonator end face to the other resonator end face, i.e., over the whole length in the resonator length direction of the resonator. On the other hand, an n-side electrode 114 is formed in ohmic contact with the back side of the n-type GaN substrate 101.

In the GaN semiconductor laser, in order to reduce internal loss, i.e., in order to improve threshold current and slope efficiency, the distance between the well layer in the active layer 104 and the p-type AlGaN electron barrier layer 107 is set to be not less than about 100 nm, whereby the internal loss is successfully reduced from 30 $cm^{-1}$ to 12 $cm^{-1}$. Attendant on this, the threshold current is lowered from 38 mA to 30 mA, and the slope efficiency is enhanced from 1 W/A to 1.4 W/A.

SUMMARY OF THE INVENTION

However, the present inventor found out that the above-mentioned GaN semiconductor lasers according to the related art have the problem that the lifetime thereof would be shortened due to dispersions of the manufacturing process thereof.

Thus, there is a need for a semiconductor laser using a nitride type Group III-V compound semiconductor which has been improved in reliability and lifetime while maintaining a low threshold current and a high slope efficiency characteristic, and for a method of manufacturing the same.

There is also a need for an optical pickup and an optical disk system which each use the semiconductor laser as a light source.

In order to fulfill the above-mentioned needs, the present inventor made intensive and extensive investigations and, as a result, has made the present invention. This process will be outlined as follows.

Deterioration of the short-lifetime ones of the above-mentioned GaN semiconductor lasers according to the related art was analyzed. As a result, it was found out that, in forming the ridge stripe 110 by dry etching of the p-type GaN contact layer 109 and an upper part of the p-type GaN/undoped AlGaN superlattice clad layer 108, damages due to dry etching are generated in the p-type AlGaN electron barrier layer 107 in lateral areas on both sides of the ridge stripe 110, the undoped AlGaN optical waveguide layer 106 beneath the p-type AlGaN electron barrier layer 107 and the like, to form defects or faults there. (In FIG. 14, the dotted regions are the regions in which the damages due to dry etching are generated). It was also found out that when a current is passed between the p-side electrode 113 and the n-side electrode 114 at the time of operating the GaN semiconductor laser, the current flowing through the lateral areas on both sides of the ridge stripe 110 causes multiplication of the defects (faults) in the p-type AlGaN electron barrier layer 107, the undoped AlGaN optical waveguide layer 106 thereunder and the like, resulting in accelerated deterioration of the GaN semiconductor laser. The amount of the damages due to dry etching varies depending on the differences in the manner in which the damages are generated due to dispersions of etching in the dry etching step, dispersions of crystal quality in the steps of crystal growth of the layers constituting the laser structure, and the like, and is extremely difficult to control.

The present inventor, based on his own findings as above, made examination of the deteriorations of the GaN semiconductor laser by varying the depth of the ridge stripe 110. As a result of the examination, it was found out that the deterioration tends to decrease with an increase in the depth of the ridge stripe 110. Specifically, it was found out that the deterioration is remarkably lessened when the ridge stripe 110 is formed to penetrate completely the p-type AlGaN electron layer 107 and the bottom surface in areas on both sides of the ridge stripe 110 is located at a depth of not less than 10 nm from the lower surface of the p-type AlGaN electron barrier layer 107. Based on this finding, the present invention has been completed.

According to a first embodiment of the present invention, there is provided a semiconductor laser using a nitride type Group III-V compound semiconductor, including:

an n-side clad layer;

an n-side optical waveguide layer over the n-side clad layer;

an active layer over the n-side optical waveguide layer;

a p-side optical waveguide layer over the active layer;

an electron barrier layer over the p-side optical waveguide layer; and a p-side clad layer over the electron barrier layer;

wherein a ridge stripe is formed at an upper part of the p-side optical waveguide layer, the electron barrier layer and the p-side clad layer, and the distance between the electron barrier layer and a bottom surface in areas on both sides of the ridge stripe is not less than 10 nm.

According to a second embodiment of the present invention, there is provided a method of manufacturing a semiconductor laser, including the steps of:

sequentially growing an n-side clad layer, an n-side optical waveguide layer, an active layer, a p-side optical waveguide layer, an electron barrier layer and a p-side clad layer over a substrate; and patterning the p-side clad layer, the electron barrier and an upper part of the p-side optical waveguide layer to form a ridge stripe in such a manner that the distance between the electron barrier layer and a bottom surface in areas on both sides of the ridge stripe is not less than 10 nm.

According to a third embodiment of the present invention, there is provided an optical pickup using a semiconductor laser as a light source, the semiconductor laser including:

an n-side clad layer;

an n-side optical waveguide layer over the n-side clad layer;

an active layer over the n-side optical waveguide layer;

a p-side optical waveguide layer over the active layer;

an electron barrier layer over the p-side optical waveguide layer; and a p-side clad layer over the electron barrier layer;

wherein a ridge stripe is formed at an upper part of the p-side optical waveguide layer, the electron barrier layer and the p-side clad layer, and the distance between the electron barrier layer and a bottom surface in areas on both sides of the ridge stripe is not less than 10 nm.

According to a fourth embodiment of the present invention, there is provided an optical disk system using a semiconductor laser as a light source, the semiconductor laser including:

an n-side clad layer;

an n-side optical waveguide layer over the n-side clad layer;

an active layer over the n-side optical waveguide layer;

a p-side optical waveguide layer the active layer;

an electron barrier layer over the p-side optical waveguide layer; and a p-side clad layer over the electron barrier layer;

wherein a ridge stripe is formed at an upper part of the p-side optical waveguide layer, the electron barrier layer and the p-side clad layer, and the distance between the electron barrier layer and a bottom surface in areas on both sides of the ridge stripe is not less than 10 nm.

The nitride type Group III-V compound semiconductors constituting the n-side clad layer, the n-side optical waveguide layer, the active layer, the p-side optical waveguide layer, the electron barrier layer and the p-side clad layer most generally include as follows. $Al_xB_yGa_{1-x-y-z}In_zAs_uN_{1-u-v}P_v$ (where $0 \leq x \leq 1$, $0 \leq y \leq 1$, $0 \leq z \leq 1$, $0 \leq u \leq 1$, $0 \leq v \leq 1$, $0 \leq x+y+z<1$, and $0 \leq u+v<1$), more specifically include $Al_xB_yGa_{1-x-y-z}In_zN$ (where $0 \leq x \leq 1$, $0 \leq y \leq 1$, $0 \leq z \leq 1$, and $0 \leq x+y+z<1$), and typically include $Al_xGa_{1-x-z}In_zN$ (where $0 \leq x \leq 1$, and $0 \leq z \leq 1$), with specific examples thereof including GaN, InN, AlN, AlGaN, InGaInN, and AlGaInN. The n-side clad layer, the n-side optical waveguide layer, the active layer, the p-side optical waveguide layer, the electron barrier layer and the p-side clad layer can be sequentially grown in this order over a substrate typically by a metal organic chemical vapor deposition (MOCVD) or any of various epitaxial growth methods such as hydride vapor phase epitaxial growth, halide vapor phase epitaxial growth (HVPE), and molecular beam epitaxy (MBE), which are not limitative. The substrate is preferably a conductive semiconductor substrate, particularly a nitride type Group III-V compound semiconductor substrate (most typically a GaN substrate), but the substrate may be an insulating substrate such as a sapphire substrate. Where a conductive semiconductor substrate is used, typically, an n-side electrode is formed on the back side of the substrate. A p-side electrode, typically, is formed on a p-type contact layer, which is provided over the p-side clad layer.

From the viewpoint of more assured prevention of the semiconductor laser from deterioration, the distance between the electron barrier layer and a bottom surface in areas on both side of the ridge stripe is preferably not less than 20 nm. On the other hand, from the viewpoint of prevention of the active layer from being deteriorated due to damages introduced to the bottom surface in the areas on both side of the ridge stripe upon formation of the ridge stripe, the distance from the bottom surface in the areas on both sides of the ridge stripe and the active layer is preferably not less than 100 nm. In addition, from the viewpoints of reducing internal loss of the semiconductor laser, reducing the threshold current and enhancing the slope efficiency, the distance between the electron barrier layer and the active layer is preferably not less than 110 nm. On the other hand, if the distance between the electron barrier layer and the active layer exceeds 300 nm, the internal quantum efficiency is lowered. Therefore, the distance between the electron barrier layer and the active layer is preferably not more than 300 nm.

In a preferred example, the p-side optical waveguide layer includes an undoped or n-type (preferably, lightly doped) nitride type Group III-V compound semiconductor layer containing In and Ga (for example, an undoped or n-type InGaN layer) and an undoped or n-type (preferably, lightly doped) nitride type Group III-V compound semiconductor layer containing Al and Ga (for example, an undoped or n-type AlGaN layer) formed thereon. In general, the p-side optical waveguide layer includes one of undoped or n-type AlGaN layer, GaN layer, InGaN layer, AlGaInN layer and the like or a combination of two or more of them. The electron barrier layer is generally a p-type nitride type Group III-V compound semiconductor layer containing Al and Ga, preferably an $Al_xGa_{1-x}N$ layer ($0.15 \leq x<1$).

The ridge stripes, typically, are formed by patterning the p-side clad layer, the electron barrier layer and an upper part of the p-side optical waveguide layer by dry etching.

Meanwhile, as the p-side electrode of a GaN semiconductor laser, an Ni-based electrode or a Pd- or Pt-based electrode has hitherto been mainly used (refer to, for example, Japanese Patent Laid-open Nos. Hei 10-303504, Hei 10-41254, and 2002-335048). In the case of the Ni-based electrode, a lowering in the contact resistance of the p-side electrode can be contrived by an alloying step carried out after formation of the electrode. In the cases of the Pd- or Pt-based electrodes, however, the contact resistance of the p-side electrode would adversely be increased when the alloying step is conducted at a temperature of 300° C. or above. Therefore, in the case of using a Pd- or Pt-based electrode as the p-side electrode 113 of the GaN semiconductor laser shown in FIG. 13, it is a common practice not to conduct an alloying step after the formation of the electrode. However, according to the present inventor's finding, in the case where the alloying step is not conducted after the formation of the p-side electrode 113 as above-mentioned, the adhesion of the p-side electrode 113 to the p-type GaN contact layer 109 is insufficient, so that the p-side electrode 113 would be partly or completely exfoliated from the vicinity of the resonator end face in forming the resonator end faces by cleaving the n-type GaN substrate 101 provided with the laser structure from the n-type GaN substrate 101 side. The partial or complete exfoliation of the p-side electrode 113 results in that heat is generated in the area of the p-side electrode 113 at the time of passing a current, leading to a failure of the GaN semiconductor laser. This problem is especially serious in the case where the GaN semiconductor laser is used at a high output. As an example, a sectional transmission electron microscope (TEM) photograph of the parts of the p-side electrode 113 and the ridge stripe 110 in the vicinity of a resonator end face in the case where the p-side electrode 113 is composed of a laminate metallic film having five metal films of (Pd/Pt)/(Ti/Pt/Ni)= (50 nm/100 nm)/(10 nm/100 nm/100 nm) is shown in FIG. 15. As shown in FIG. 15, in the vicinity of the resonator end face formed by the cleavage, a trace of pulling at the time of cleavage is observed in the p-side electrode 113 (simply referred to as ELECTRODE in FIG. 15). In addition, a gap with a thickness of about 10 nm is observed between the p-side electrode 113 and the p-type GaN contact layer 109 (simply referred to as SEMICONDUCTOR in FIG. 15). Besides, when a current was increased for obtaining a higher output in the GaN semiconductor laser with the structure shown in FIG. 15, a phenomenon in which the p-side electrode 113 is exfoliated mostly and broken in the vicinity of the resonator end face was observed, as shown in FIG. 16. In order to preventing the p-side electrode 113 in the vicinity of the resonator end face from partly or completely exfoliated at the time of forming the resonator end faces by cleaving the n-type GaN substrate 101 provided with the laser structure, there may be contemplated the adoption of such a countermeasure as (1) to enhance the adhesion between the p-type GaN contact layer 109 and the p-side electrode 113 by introducing an alloying step after formation of the p-side electrode 113, (2) to reduce the stress at the time of cleavage, and (3) to prevent the stress at the time of cleavage from being transmitted to the interface between the p-side electrode 113 and the p-type GaN contact layer 109. In the case of (1), the adhesion can generally be enhanced by alloying between the p-type GaN contact layer 109 and the p-side electrode 113, but this approach is disadvantageous in that the contact resistance of the p-side electrode 113 is worsened, as has been above-mentioned. In the cases of (2) and (3), the hard GaN semiconductor crystal is cleaved at the time of the cleavage, so that it is needed to generate a certain level of stress, and there is a limit to the lowering of the stress. On the other hand, though the stress can be lowered by reducing the thickness of the n-type GaN substrate 101, this makes the n-type GaN substrate 101 more susceptible to breakage, leading to a conspicuous lowering in yield. Therefore, there is a need for a special electrode structure such that the stress at the time of cleavage is not transmitted to the interface between the p-side electrode 113 and the p-type GaN contact layer 109 and that a reduction in the contact resistance of the p-side electrode 113 is realized, under a non-alloying condition (the condition where alloying is not conducted) as in the case of using a Pd- or Pt-based electrode as the p-side electrode 113.

Taking this point into consideration, the present inventor made intensive and extensive investigations. As a result of the investigations, it was found out that the p-side electrode 113 in the vicinity of a resonator end face after the cleavage can be prevented from being partly or completely exfoliated from the p-type GaN contact layer 109, by using a metallic laminate film including n metal films (n is an integer of not less than 2) as an electrode formed without any alloying step on a ridge stripe, more generally a nitride type Group III-V compound semiconductor layer, setting the total thickness of the metallic laminate film to be not less than 300 nm, and setting the equivalent mean modulus of rigidity defined for the metallic laminate film in the following manner to be not more than 55 GPa. More specifically, in the case of forming a p-side electrode on a ridge stripe without carrying out any alloying treatment at the interface between them, a configuration in which at least a part of the p-side electrode includes a metallic laminate film including n metal films (n is an integer of not less than 2), wherein the total thickness of the metallic laminate film is not less than 300 nm, and the equivalent mean modulus of rigidity, Ge, of the metallic laminate film defined by the following formula:

$$G_e = \frac{\sum_{i=1}^{n} G_i \times t_i}{\sum_{i=1}^{n} t_i} \quad \text{[Math 1]}$$

where $G_i$ and $t_i$ represent the modulus of rigidity and the thickness of the i-th metal film as numbered from the bottom side of the metallic laminate film, satisfies the condition of $G_e \leq 55$ GPa, is effective in preventing the exfoliation of the p-side electrode. Preferably, but not limitatively, the total thickness of the metallic laminate film constituting the p-side electrode is not less than 500 nm, and $G_e \leq 50$ GPa.

The number n of metal films included in the metallic laminate film constituting the p-side electrode and the kinds of component metals and the thickness of each of the metal films can basically be selected freely insofar as the total thickness of the laminate metal film is not less than 300 nm, $G_e \leq 55$ GPa, and the metallic laminate film can be formed on and in ohmic contact with the ridge stripe without requiring the alloying treatment. The values of Young's modulus and modulus of rigidity for some metals are given below, and the relationship between Young's modulus and modulus of rigidity is as shown in FIG. 17. In addition, for reference, the coefficients of linear expansion of these metals are set forth in FIG. 18.

|  | Young's modulus ($\times 10^{10}$ Pa) | Modulus of rigidity ($\times 10^{10}$ Pa) |
| --- | --- | --- |
| Pd | 11.3 | 5.11 |
| Pt | 16.8 | 6.1 |
| Au | 7.8 | 2.7 |
| Ti | 11.57 | 4.38 |
| Ni | 21.9 | 8.39 |
| Al | 7.03 | 2.61 |
| Ag | 8.27 | 3.03 |
| Sn | 4.99 | 1.84 |
| GaN (reference) | 15 |  |

The metallic laminate film constituting the p-side electrode, typically, includes at least one metal selected from the group composing of Pd, Pt and Ni, and the n metal films constituting the metallic laminate film are typically not mixed with each other. In addition, the n metal films constituting the metallic laminate film may be included respectively of quite different metals or they may include two or more films which are included of the same metal. The lowermost metal film in the metallic laminate film is included of a metal which can make close contact and ohmic contact with the ridge stripe, without requiring any alloying treatment, and is included typically, but not limitatively, of Pd or Pt. The p-side electrode is provided typically over the range from one resonator end face to the other resonator end face, i.e., over the whole length in the length direction of the resonator, but it may include a part composed of a metallic multilayer film which does not satisfy the above-mentioned conditions, in the resonator length direction. Specifically, for example, the p-side electrode may include a part composed of a metallic multilayer film having a total thickness of less than 300 nm, or may include a part composed of a metallic multilayer film in which $G_e$>55 GPa. From the viewpoint of effective prevention of exfoliation of the electrode at the time of cleavage for forming the resonator end faces, it is preferable, but not limitative, that at least a part, of not more than 100 µm in the resonator length direction from the resonator end face, of the p-side electrode is included of a metallic laminate film satisfying the above-mentioned conditions.

On the other hand, in a GaN semiconductor laser used as a light source in a high-density optical disk system, it may be necessary to reduce the return light noise, and a technique of causing a self-pulsation operation is known as a measure to meet the requirement. In order to realize such a self-pulsation operation, a method has been proposed in which the optical waveguide layer and/or the clad layer is provided with a saturable absorption layer, and the saturable absorption layer or layers are doped (refer to, for example, Japanese Patent Laid-open No. Hei 9-191160). This system, however, is pointed out to have the problem of instability of the self-pulsation operation with regard to temperature (refer to, for example, Japanese Patent Laid-open No. 2003-31898). Furthermore, methods of enabling the self-pulsation operation by selection of the thickness of the saturable absorption layer, the light confinement coefficient, the distance between the active layer and the saturable absorption layer, or the like, or by insertion of a widegap semiconductor between the active layer and the saturable absorption layer, have been proposed (refer to, for example, Japanese Patent Laid-open Nos. 2003-31898 and 2003-218458). Even when these conditions are used, however, it is difficult to stably obtain a semiconductor laser capable of a self-pulsation operation. For example, it has been reported that mere introduction of a p-type GaN layer between a saturable absorption layer and a p-type AlGaN layer made it difficult to achieve the self-pulsation operation (refer to, for example, Appl. Phys. Lett. 83, 1098 (2003)). In the report, it is concluded that the acceleration of recombination of carriers at the interface between the p-type AlGaN layer and the saturable absorption layer and the tunneling of carriers due to the piezo effect shorten on an effective basis the carrier lifetime in the saturable absorption layer, thereby contributing to the self-pulsation operation. In any way, such an instability becomes a serious problem in mass production of a GaN semiconductor laser capable of a self-pulsation operation. In order to solve this problem, the present inventor made intensive and extensive investigations, which will be outlined as follows. The reason for the instability of the self-pulsation operation in Appl. Phys. Lett. 83, 1098 (2003) lies in that the shortening of the carrier lifetime in the saturable absorption layer is insufficient. Therefore, it may be necessary, for solving the above-mentioned problem, to shorten on an effective basis the carrier lifetime in the saturable absorption layer. For shortening the carrier lifetime, it is important to increase the number or frequency of carrier recombination processes. The present inventor considered that positive introduction of damages due to dry etching to the saturable absorption layer is the most effective and simplest method for this purpose, and empirically found out the optimum conditions therefor. More specifically, it was found out that, in the case of forming the ridge stripes by dry etching from the p-side clad layer side for controlling the transverse mode in a semiconductor laser having a saturable absorption layer provided between the active layer and the p-side clad layer, the mean time to failure (MTTF) is maximized and a semiconductor laser capable of a stable self-pulsation operation and having a long life can be realized when the distance from a bottom surface in areas on both side of the ridge stripe to the active layer is set to be not less than 105 nm and the distance from the bottom surface in the areas on both sides of the ridge stripe to the upper surface of the saturable absorption layer is set to be not more than 100 nm. Thus, in order to obtain a semiconductor laser capable of a stable self-pulsation operation and having a long life, it is preferable, in the first to fourth embodiments of the present invention, that the saturable absorption layer is provided between the active layer and the electron barrier layer and that the distance from a bottom surface in areas on both sides of the ridge stripe, or from the bottom surfaces of grooves in the case where a pair of grooves are formed in the p-side clad layer in parallel to each other and at a predetermined spacing from each other, to the upper surface of the active layer is set to be not less than 105 nm, while the distance from the bottom surface in the area on both sides of the ridge stripe, or from the bottom surfaces of the grooves, to the upper surface of the saturable absorption layer is set to be not more than 100 nm. Here, the distance from the bottom surface in the areas on both sides of the ridge stripe or from the bottom surfaces of the grooves to the upper surface of the active layer and the distance from the bottom surface in the areas on both sides of the ridge stripe or from the bottom surfaces of the grooves to the upper surface of the saturable absorption layer are the distances as viewed in a coordinate system in which one point in the bottom surface in the areas on both sides of the ridge stripe or in the bottom surfaces of the grooves is taken as an origin and in which the direction from the origin toward the active layer is taken as the positive direction. While the distance from the bottom surface in the areas on both sides of the ridge stripe or from the bottom surfaces of the grooves to the upper surface of the saturable absorption layer is not more than 100 nm, the distance may not necessarily be positive or 0 (zero) (be in the range of 0 to 100 nm) but may be negative. The case in which this distance is negative includes the case where the bottom surface in areas on both sides of the ridge stripe or the bottom surfaces of the grooves are located between the upper surface and the lower surface of the saturable absorption layer (inclusive of the case where the bottom surface or bottom surfaces is located on the lower surface of the saturable absorption layer) and the case where the bottom surface in the areas on both sides of the ridge stripe or the bottom surfaces of the grooves are located at a level which is deeper than the lower surface of the saturable absorption layer and shallower than the upper surface of the active layer.

Typically, damages are generated in the saturable absorption layer in the vicinity of the bottom surface in the areas on both sides of the ridge stripe or the bottom surfaces and/or the side surfaces of the grooves. The cause of the damages is not particularly limited, but the damages are etching damages generated in the case where the bottom surface in the areas on both sides of the ridge stripe or the grooves are formed by dry etching of at least the second clad layer. In the case where the distance from the bottom surface in the areas on both sides of the ridge stripe or from the bottom surfaces of the grooves to the upper surface of the saturable absorption layer is in the range of 100 to 0 nm, the damages are generated mostly in the saturable absorption layer in the vicinity of the bottom surface in the areas on both sides of the ridge stripe or the bottom surfaces of the grooves. In the cases where the distance from the bottom surface in the areas on both sides of the ridge stripe or from the bottom surfaces of the grooves to the upper surface of the saturable absorption layer is less than 0 nm, in other words, in the case where the bottom surface in the areas on both sides of the ridge stripe or the bottom surfaces of the grooves are located between the upper surface and the lower surface of the saturable absorption layer or in the case where the bottom surface in the areas on both sides of the ridge stripe or the bottom surfaces of the grooves are located at a level deeper than the lower surface of the saturable absorption layer and shallower than the upper surface of the active layer, the damages are generated in the saturable absorption layer in the vicinity of the bottom surface in the areas on both sides of the ridge stripe and lower parts of the side surfaces of the ridge stripes or in the vicinity of the side surfaces of the ridge stripe, or in the vicinity of the bottom surfaces and lower parts of the side surfaces of the grooves or in the vicinity of the side surfaces of the grooves. The saturable absorption layer is doped (in general, doped in a high concentration) with an impurity, as required, whereby centers of non-radiative recombination are formed.

Preferably, an insulating film is formed over the side surfaces of the ridge stripes, in the inside of the grooves and over a layer in the areas on the outer sides of the grooves. The insulating film may basically be formed from any material insofar as the material has an electrically insulating property or has a sufficiently high resistance. From the viewpoint of reduction of the electrostatic capacity of the semiconductor laser, however, the material preferably has a low dielectric constant. In addition, the insulating film may have a monolayer structure or a multilayer structure. In the case where the insulating film has a two-layer structure, the upper layer is preferably composed of a film having a high absorption coefficient for rays at the oscillation frequency, for example an undoped Si film in the case where the laser beam wavelength is in a violet wavelength band, whereas the lower layer is preferably composed, for example, of an $SiO_2$ film.

In the case of forming the grooves on both sides of the ridge stripe and forming the p-side electrode in the state of extending even to the outer sides of the grooves, the thickness of the part over the contact layer in the areas on the outer sides of the grooves, of the insulating film which is formed on the side surfaces of the ridge stripe and in the inside of the grooves and over the contact layer in the areas on the outer sides of the grooves, is made to be sufficiently large. This configuration ensures that the distance between the p-side electrode and the n-side electrode in the areas on the outer sides of the grooves can be set larger as compared with the distance in the areas of the ridge stripe or the grooves, so that it is possible to contrive a reduction in the electrostatic capacity between the electrodes, to contrive enhancement of high-frequency characteristics of the semiconductor laser, and to prevent electrostatic leak and electrostatic breakdown.

The optical disk system in the present invention includes those for exclusive use for reproduction (reading), those for exclusive use for recording (writing), and those capable of both reproduction and recording; in addition, the reproducing and/or recording system is not particularly limited. The optical pickup in the present invention is one that is suitable for use in such an optical disk system.

In the first to fourth embodiments of the present invention configured as above-mentioned, the ridge stripes are each formed at an upper part of the p-side optical waveguide layer, the electron barrier layer and the p-side clad layer, and the distance between the electron barrier layer and the bottom surface in areas on both sides of the ridge stripe is not less than 10 nm. In other words, the electron barrier layer is entirely included in the ridge stripe, and the distance between the electron barrier layer and the bottom surface in the areas on both sides of the ridge stripe is not less than 10 nm. This configuration makes it possible to prevent damages generated in forming the ridge stripes by dry etching from being generated in the electron barrier layer or the p-side optical waveguide layer therebeneath.

According to an embodiment of the present invention, the damages generated in forming the ridge stripes by dry etching can be prevented from being generated in the electron barrier layer or the p-side optical waveguide layer therebeneath. Therefore, a semiconductor laser using a nitride type Group III-V compound semiconductor and having a high reliability and a long life, irrespectively of dispersions of etching in a dry etching step, can be realized while maintaining a low threshold current and a high slope efficiency characteristic, by appropriately setting the distance between the active layer and the electron barrier layer. With this semiconductor laser used as a light source, furthermore, a high-performance optical disk system can be realized.

DETAILED DESCRIPTION OF THE PREFERRED EMBODIMENTS

Figure 1:
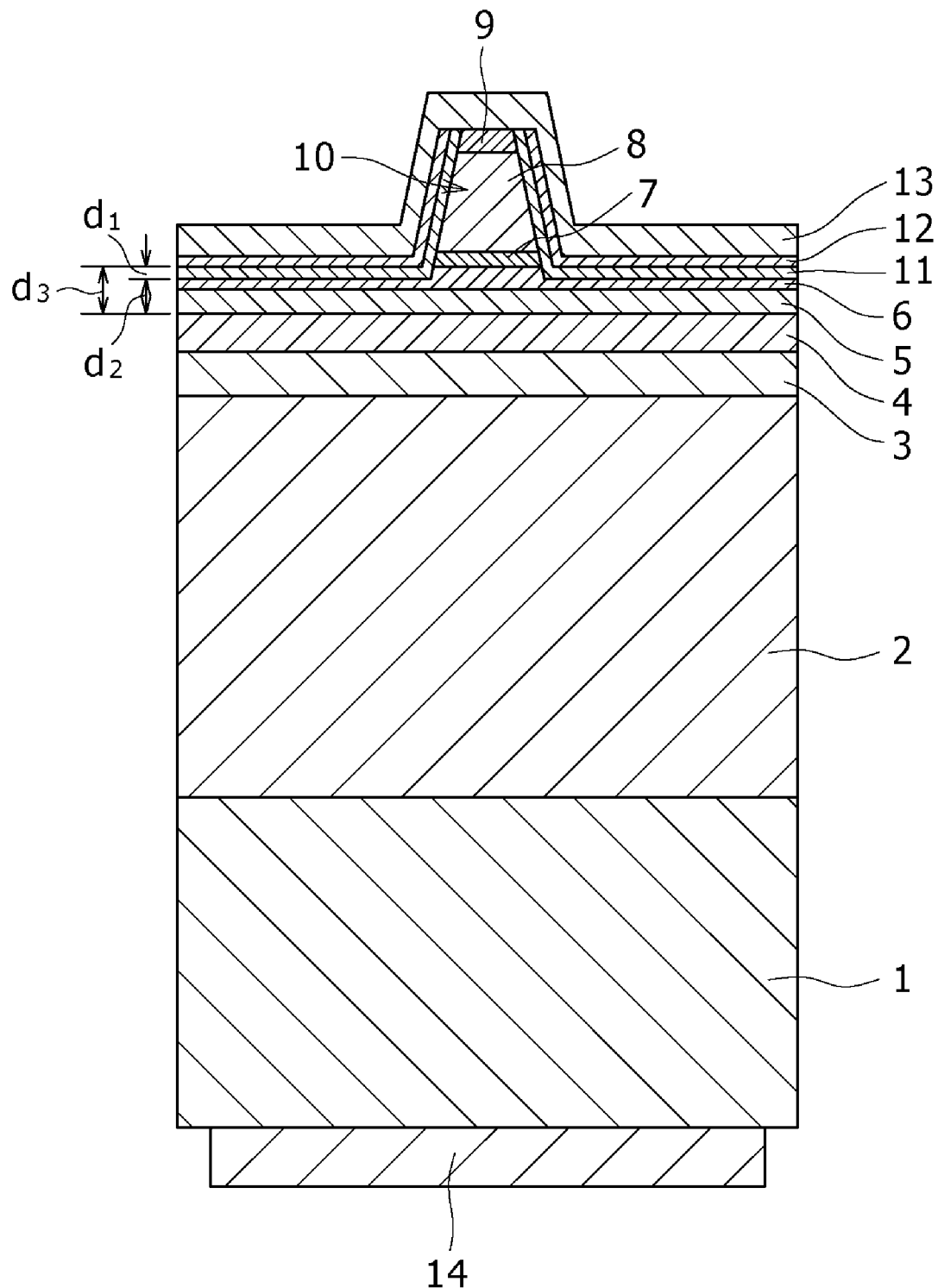
FIG. 1 is a sectional view of a GaN semiconductor laser according to a first embodiment of the present invention.

Now, some embodiments of the present invention will be described below, referring to the drawings. Incidentally, in all the drawings showing the embodiments, the same or corresponding parts are denoted by the same symbols.

FIG. 1 shows a GaN semiconductor laser according to a first embodiment of the present invention.

As shown in FIG. 1, in this GaN semiconductor laser, an n-type AlGaN clad layer 2, an n-type GaN optical waveguide layer 3, an active layer 4 of an undoped $Ga_{1-x}In_xN$ (quantum well layer)/$Ga_{1-y}In_yN$ (barrier layer, x>y) multiple quantum well structure, an undoped InGaN optical waveguide layer 5, an undoped AlGaN optical waveguide layer 6, a p-type AlGaN electron barrier layer 7, a p-type GaN/undoped AlGaN superlattice clad layer 8, and a p-type GaN contact layer 9 are sequentially stacked over an n-type GaN substrate 1. The n-type AlGaN clad layer 2 and the n-type GaN optical waveguide layer 3 are doped with an n-type impurity, for example, Si. On the other hand, the p-type AlGaN electron barrier layer 7, a p-type GaN layer constituting the p-type GaN/undoped AlGaN superlattice clad layer 8, and the p-type GaN contact layer 9 are doped with a p-type impurity, for example, Mg. An upper part of the undoped AlGaN optical waveguide layer 6, the p-type AlGaN electron barrier layer 7, the p-type GaN/undoped AlGaN superlattice clad layer 8, and the p-type GaN contact layer 9 are provided with ridge stripes 10 extending rectilinearly in one direction (the resonator length direction). An $SiO_2$ film 11 is formed to extend on the p-type GaN/undoped AlGaN superlattice clad layer 8 on both side surfaces of the ridge stripe 10 and on areas on the outer sides thereof, and an undoped Si film 12 is formed to extend on the $SiO_2$ film 11. A p-side electrode 13 is formed in ohmic contact with the p-type GaN contact layer 9 at the ridge stripe 10. The p-side electrode 13 is formed to extend on the undoped Si film 12, and is formed to range from an end face of a resonator to the other end face of the resonator, i.e., formed to range over the whole length in the length direction of the resonator. On the other hand, an n-side electrode 14 is formed in ohmic contact with the back side of the n-type GaN substrate 1.

In the GaN semiconductor laser, the depth of the ridge stripe 10 is so set that $d_1 \geq 10$ nm, where $d_1$ is the distance between the p-type AlGaN electron barrier layer 7 and the bottom surface in the areas on both sides of the ridge stripe 10. In this case, the p-type AlGaN electron barrier layer 7 is entirely included in the ridge stripe 10. In addition, the depth of the ridge stripe 10 and the thicknesses of the undoped InGaN optical waveguide layer 5 and the undoped AlGaN optical waveguide layer 6 are so set that $d_2 \geq 100$ nm and 300 nm $\geq d_3 \geq 110$ nm, where $d_2$ is the distance between the bottom surface in the areas on both sides of the ridge stripe 10 and the one, closest to the p-type AlGaN electron barrier layer 7, of the quantum well layers contained in the active layer 5, and $d_3$ is the distance from the p-type AlGaN electron barrier layer 7 and the one, closest to the p-type AlGaN electron barrier layer 7, of the quantum well layers contained in the active layer 5.

Now, a method of manufacturing the GaN semiconductor laser will be described below.

First, the n-type AlGaN clad layer 2, the n-type GaN optical waveguide layer 3, the active layer 4, the undoped InGaN optical waveguide layer 5, the undoped AlGaN optical waveguide layer 6, the p-type AlGaN electron barrier layer 7, the p-type GaN/undoped AlGaN superlattice clad layer 8, and the p-type GaN contact layer 9 are sequentially epitaxially grown over the n-type GaN substrate 1 by, for example, the metal organic chemical vapor deposition (MOCVD) method. Here, the n-type AlGaN clad layer 2, the n-type GaN optical waveguide layer 3, the undoped AlGaN optical waveguide layer 6, the p-type AlGaN electron barrier layer 7, the p-type GaN/undoped AlGaN superlattice clad layer 8, and the p-type GaN contact layer 9 which do not contain In are grown at temperatures of, for example, about 1000° C., whereas the $Ga_{1-x}In_xN/Ga_{1-y}In_yN$ multiple quantum well structure active layer 4, and the undoped InGaN optical waveguide layer 5 which contain In are grown at temperatures of, for example, 700 to 800° C., specifically, for example, 730° C., though the examples are non-limitative examples.

The materials for growing the GaN semiconductor layers may be as follows. Examples of the material of Ga include triethylgallium ($(C_2H_5)_3Ga$; TEG) and teimethylgallium ($(CH_3)_3Ga$; TMG). Examples of the material of Al include trimethylaluminum ($(CH_3)_3Al$; TMA). Examples of the material of In include triethylindium ($(C_2H_5)_3In$; TEI) and trimethylindium ($(CH_3)_3In$; TMI). Examples of the material of N include ammonia ($NH_3$). Non-limitative examples of the dopants are as follows. Examples of the n-type dopant include silane ($SiH_4$), whereas examples of the p-type dopant include bis(methylcyclopentadienyl)magnesium ($(CH_3C_5H_4)_2Mg$), bis(ethylcyclopentadienyl)magnesium ($(C_2H_5C_5H_4)_2Mg$), and bis(cyclopentadienyl)magnesium ($(C_5H_5)_2Mg$). Further, non-limitative examples of the carrier gas which can be used in growing the GaN semiconductor layers include $H_2$ gas.

Next, an insulating film (not shown), for example, an $SiO_2$ film, is formed on the whole surface area of the assembly being treated, and then the insulating film is patterned into a predetermined shape by etching. Subsequently, using this insulating film as an etching mask, dry etching such as reactive ion etching (RIE) is conducted to etch the p-type GaN contact layer 9, the p-type GaN/undoped AlGaN superlattice clad layer 8, the p-type AlGaN electron barrier layer 7, and an upper part of the undoped AlGaN optical waveguide layer 6, thereby forming each of the ridge stripes 10. Next, the insulating film thus used as the etching mask is removed by etching, then the $SiO_2$ film 11 and the undoped Si film 12 are sequentially formed over the whole surface area, and the portions of these films located over the ridge stripe 10 are selectively etched away, to expose the upper surface of the ridge stripe 10. Subsequently, the p-side electrode 13 is formed on the undoped Si film 12 by a lift-off method or the like. Next, if necessary, the n-type GaN substrate 1 is polished from the back side thereof, to reduce the thickness to a predetermined thickness. Subsequently, the n-side electrode 18 is formed on the back side of the n-type GaN substrate 1 by a lift-off method or the like.

Thereafter, the n-type GaN substrate 1 thus provided with the laser structures are processed into a bar shape by cleavage or the like, to form resonator end faces, and then end face coatings are formed, as required. Further, the thus processed bar is split into chips.

In this manner, the GaN semiconductor laser as shown in FIG. 1 is manufactured.

Specific examples of the thicknesses and compositions of the GaN semiconductor layers constituting the laser structure are as follows. The n-type AlGaN clad layer 2 has a thickness of 1.3 μm, and an Al compositional ratio of 0.07. The n-type GaN optical waveguide layer 3 has a thickness of 0.1 μm. The $Ga_{1-x}In_xN$ layer constituting the quantum well layer in the active layer 4 has a thickness of 3 nm and an In compositional ratio x of 0.08, while the $Ga_{1-y}In_yN$ layer constituting the barrier layer has a thickness of 7 nm and an In compositional ratio y of 0.02, with the number of wells being 3. The undoped InGaN optical waveguide layer 5 has a thickness of 40 nm and an In compositional ratio of 0.02. The undoped AlGaN optical waveguide layer 6 has a thickness of 60 nm and an Al compositional ratio of 0.02. The p-type AlGaN electron barrier layer 7 has a thickness of 20 nm and an Al compositional ratio of 0.20. The p-type GaN/undoped AlGaN superlattice clad layer 8 has a thickness of 0.5 μm, and the undoped AlGaN layer of the p-type GaN/undoped AlGaN superlattice clad layer 8 has an Al compositional ratio of 0.10. The p-type GaN contact layer 9 has a thickness of 0.1 μm. The width of the ridge stripe 10 is, for example, 1.5-2 μm.

Figure 2:
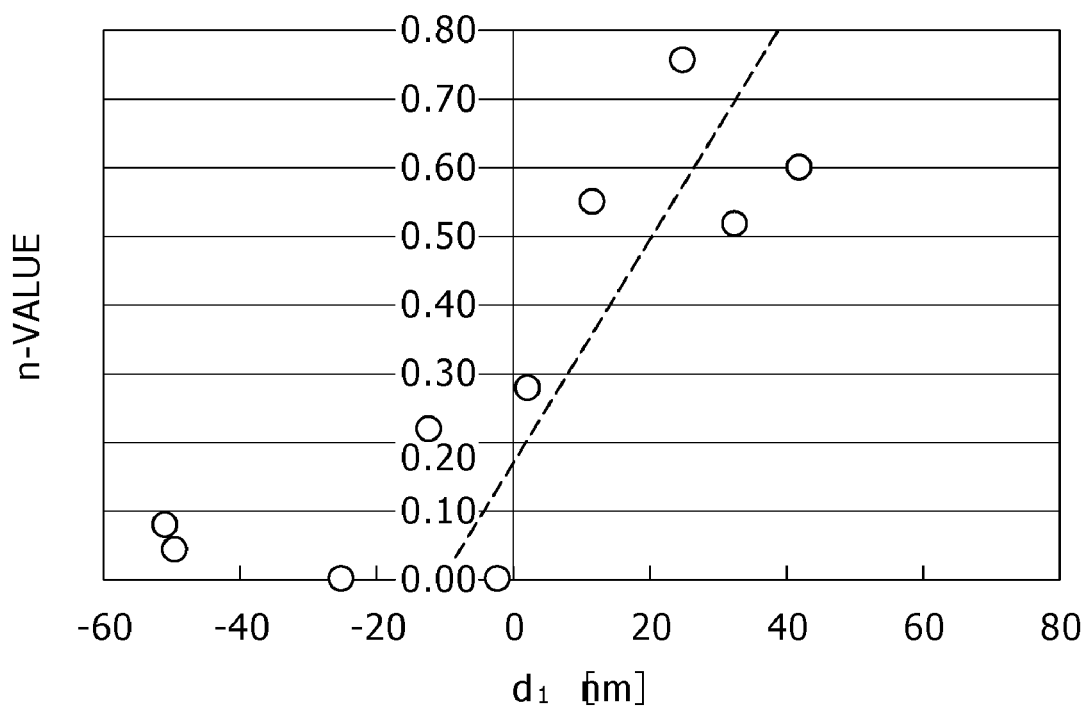
FIG. 2 is a general diagram showing the correlation between $d_1$ and n-value, for the GaN semiconductor laser according to the first embodiment of the present invention.

Here, n-value is defined by the formula $I_{op}=A \times t^n$ ($I_{op}$ is operating current, A is a constant, and t is time) of current deterioration factor of the semiconductor laser. FIG. 2 shows the correlation between the distance $d_1$ from the lower surface of the p-type AlGaN electron barrier layer 7 to the bottom surface in the areas on both sides of the ridge stripe 10 and the n-value, in the case where GaN semiconductor lasers are manufactured by varying the depth of the ridge stripe 10 and adopting a coordinate system in which one point in the lower surface of the p-type AlGaN electron barrier layer 7 is taken as the origin and the direction of going away from the active layer 4 is taken as the positive direction. It is to be noted here that $d_1$ is measured by cleaving the GaN semiconductor laser along a plane orthogonal to the resonator length direction and observing the cleaved section under a scanning electron microscope (SEM) (sectional SEM observation), and is attended by an error of about 10 nm because of dispersion of the thicknesses of the layers in forming the laser structure and dispersion of etching in forming the ridge stripe 10 by etching. It is seen from FIG. 2 that the n-value is substantially 0 when $d \leqq -10$ nm, the n-value can be more securely made to be substantially 0 when $d \leqq -20$ nm, whereby a GaN semiconductor laser substantially free of generation of current deterioration can be obtained.

Figure 3:
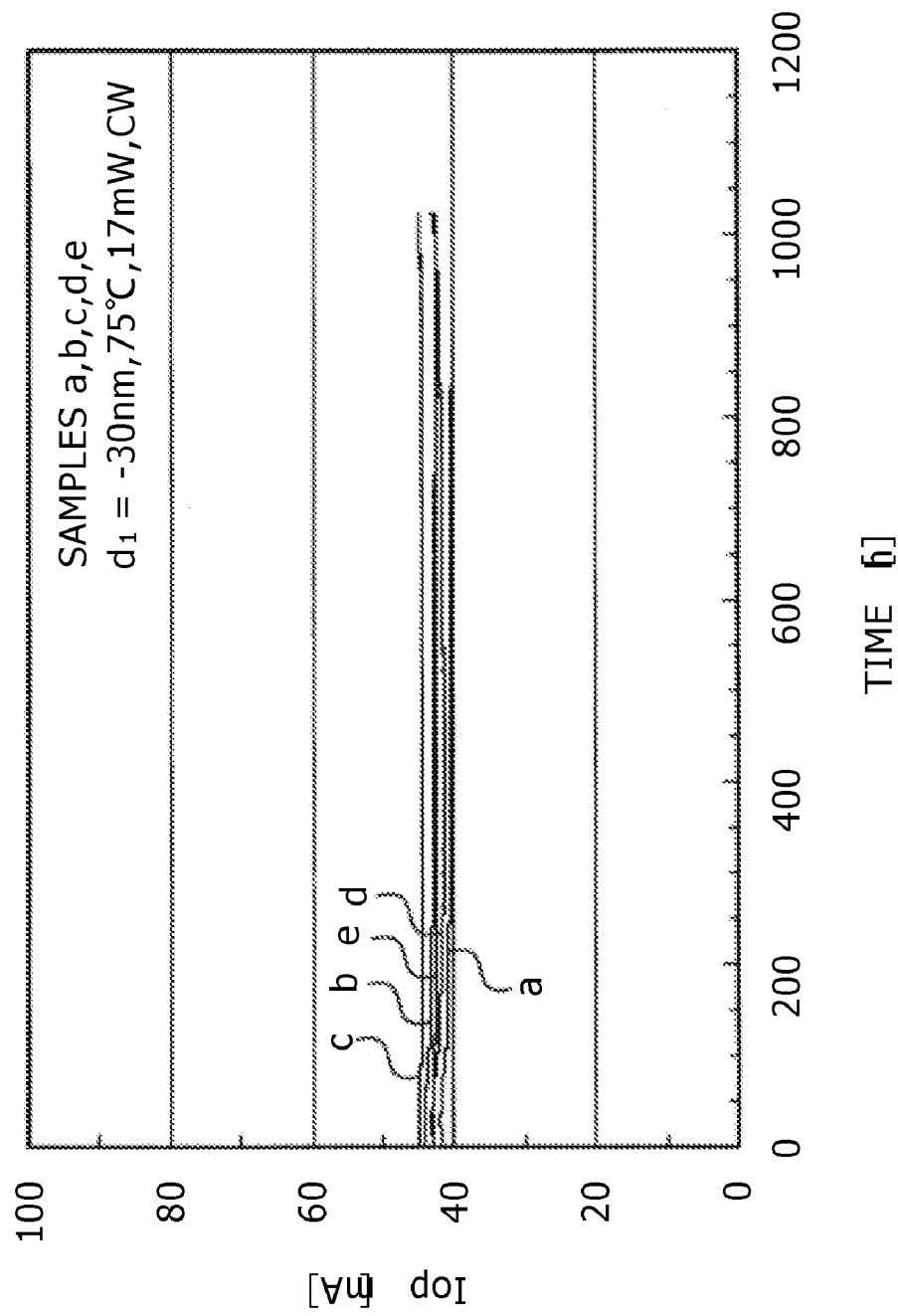
FIG. 3 is a general diagram showing the results of a long-term lifetime test on the GaN semiconductor laser according to the first embodiment of the present invention.

FIG. 3 shows the results of a long-term lifetime test of five GaN semiconductor lasers (Samples a, b, c, d, and e) with $d_1$=−30 nm under the conditions of 75° C., 17 mW, and CW (continuous oscillation). Initial values of $I_{op}$ are 41.69 mA, 43.95 mA, 44.62 mA, 42.86 mA, and 42.68 mA for Samples a, b, c, d, and e, respectively. It is seen from FIG. 3 that for each of these GaN semiconductor lasers, the initial value of $I_{op}$ is maintained even after the lapse of 1000 hr, i.e., generation of current deterioration is prevented over a period of no less than 1000 hr.

In this manner, according to the first embodiment of the present invention, the ridge stripe 10 is so formed as to completely penetrate the p-type AlGaN electron barrier layer 7, and the depth of the ridge stripe 10 is so set that $d_1 \geqq 10$ nm, where $d_1$ is the distance between the p-type AlGaN electron barrier layer 7 and the bottom surface in the areas on both sides of the ridge stripe 10. As a result of this configuration, it is possible to restrain current deterioration in the GaN semiconductor laser and to obtain a GaN semiconductor laser having a long lifetime and a high reliability, irrespectively of dispersions of etching in dry etching for forming the ridge stripe 10 or the like factors. In addition, it is ensured that $d_2 \geqq 10$ nm, where $d_2$ is the distance between the bottom surface in the areas on both sides of the ridge stripe 10 and the one, closest to the p-type AlGaN electron barrier layer 7, of the quantum wells contained in the active layer 5, whereby a low threshold current and a high slope efficiency characteristic can be obtained.

Now, a GaN semiconductor laser according to a second embodiment of the present invention will be described below.

In this GaN semiconductor laser, at least a portion, of not more than 100 μm in the resonator length direction from a resonator end face, of the p-side electrode 13, preferably the whole part of the p-side electrode, is composed of a metallic laminate film including n metal films (n is an integer of not less than 2), with the total thickness of the metallic laminate film being not less than 300 nm, and it is ensured that $G_e \leqq 55$ GPa. This configuration makes it possible to effectively prevent the p-side electrode 13 from exfoliating from the p-type GaN contact layer 9 at the time of cleavage for forming the resonator end faces.

In manufacturing this GaN semiconductor laser, the steps up to the formation of the undoped Si film 12 are conducted in the same manner as in the method of manufacturing the GaN semiconductor laser according to the first embodiment above, and then the p-side electrode 13 is formed on the undoped Si film 12. Thereafter, the n-side electrode 14 is formed on the back side of the n-type GaN substrate 1, the n-type GaN substrate 1 provided with the laser structure is processed into a bar shape by cleavage to form a pair of resonator end faces, then end face coatings are formed, as required, and the thus processed bar is split into chips. At the time of cleavage for forming the resonator end faces, at least the portion, of not more than 100 μm in the resonator length direction from the resonator end face, of the p-side electrode 13 is composed of the metallic laminate film having a total thickness of not less than 300 nm and satisfying the condition of $G_e \leqq 55$ GPa, whereby exfoliation of the p-side electrode 13 can be effectively prevented from occurring.

Example

A p-side electrode 13 was composed of a metallic multi-layer film having six metal films of (Pd/Pt)/(Ti/Pt/Au/Pt)=(50 nm/100 nm)/(10 nm/100 nm/200 nm/100 nm). The total thickness of the metallic multilayer film was 50+100+10+100+200+100=560 nm, and the equivalent mean modulus of rigidity of the metallic multilayer film was:

$$G_e = (5.11 \times 10^{10} \times 50 \times 10^{-9} + 6.1 \times 10^{10} \times 100 \times 10^{-9} +$$
$$4.38 \times 10^{10} \times 10 \times 10^{-9} + 6.1 \times 10^{10} \times 100 \times 10^{-9} + 2.7 \times$$
$$10^{10} \times 200 \times 10^{-9} + 6.1 \times 10^{10} \times 100 \times 10^{-9})/50 \times$$
$$10^{-9} + 100 \times 10^{-9} + 10 \times 10^{-9} + 100 \times 10^{-9} + 200 \times 10^{-9} +$$
$$100 \times 10^{-9})$$
$$= 26693/(560 \times 10^{-9})$$
$$= 4.766 \times 10^{10} \text{Pa}$$
$$= 47.66 \text{GPa},$$

so that the total thickness of the metallic multilayer film was not less than 300 nm and the condition of $G_e \leqq 55$ GPa was satisfied.

Figure 4:
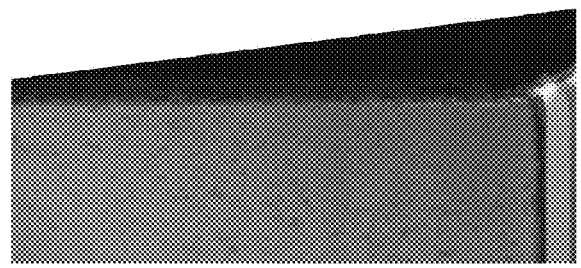
FIG. 4 is a drawing-substituting photograph showing a sectional TEM photograph of an example of a GaN semiconductor laser according to a second embodiment of the present invention.

A sectional transmission electron microscope (TEM) photograph of the part of the p-side electrode 13 and the ridge stripe 10 in the vicinity of a resonator end face in the case where the p-side electrode 13 was thus composed of the metallic multilayer film having six metal films of (Pd/Pt)/(Ti/Pt/Au/Pt)=(50 nm/100 nm)/(10 nm/100 nm/200 nm/100 nm) is shown in FIG. 4. As shown in FIG. 4, no gap is observed between the p-side electrode 13 (indicated simply as ELECTRODE in FIG. 4) in the vicinity of the resonator end face formed by cleavage and the p-type GaN contact layer 9 (indicated simply as SEMICONDUCTOR in FIG. 4). In addition, when the condition of the p-side electrode 13 in the vicinity of the resonator end face in the case where the current was increased for obtaining a high output in the GaN semiconductor laser having the structure shown in FIG. 4 was observed, exfoliation of the p-side electrode 13 was not observed, and not any breakage of the p-side electrode 13 was observed.

Comparative Example

A p-side electrode 13 was composed of an existing metallic multilayer film having five metal films of (Pd/Pt)/(Ti/Pt/Ni) =(50 nm/100 nm)/(10 nm/100 nm/100 nm). The total thickness of the metallic multilayer film was 50+100+10+100+ 100=360 nm, and the equivalent mean modulus of rigidity of the metallic multilayer film was:

$$\begin{aligned}
G_e &= (5.11 \times 10^{10} \times 50 \times 10^{-9} + 6.1 \times 10^{10} \times 100 \times 10^{-9} + \\
&\quad 4.38 \times 10^{10} \times 10 \times 10^{-9} + 6.1 \times 10^{10} \times 100 \times 10^{-9} + 8.39 \times \\
&\quad 10^{10} \times 100 \times 10^{-9})/(50 \times 10^{-9} + 100 \times 10^{-9} + 10 \times 10^{-9} + \\
&\quad 100 \times 10^{-9} + 100 \times 10^{-9}) \\
&= 23583/(360 \times 10^{-9}) \\
&= 6.55 \times 10^{10} \text{Pa} \\
&= 65.5 \text{ GPa},
\end{aligned}$$

so that the total thickness of the metallic multilayer film was not less than 300 nm, and the condition of $G_e \leqq 55$ GPa was not satisfied.

Figure 15:
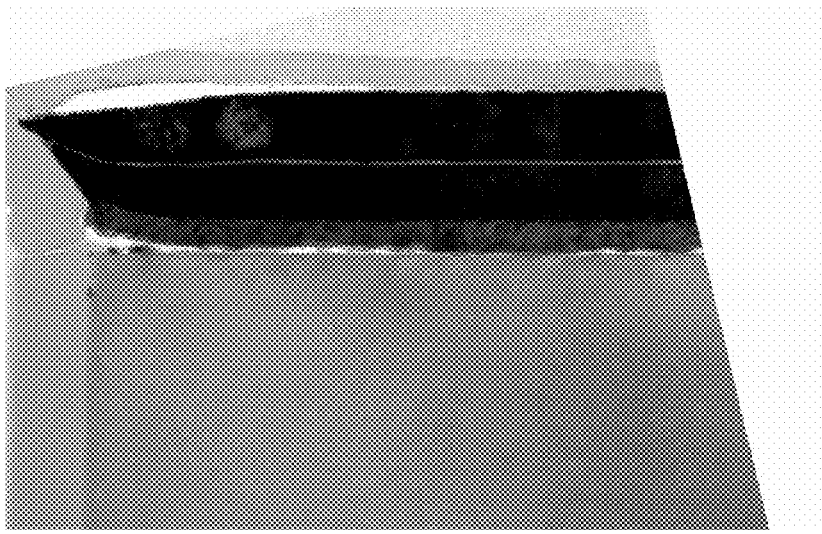
FIG. 15 is a drawing-substituting photograph showing a sectional TEM photograph of a GaN semiconductor laser according to a related art.
Figure 16:
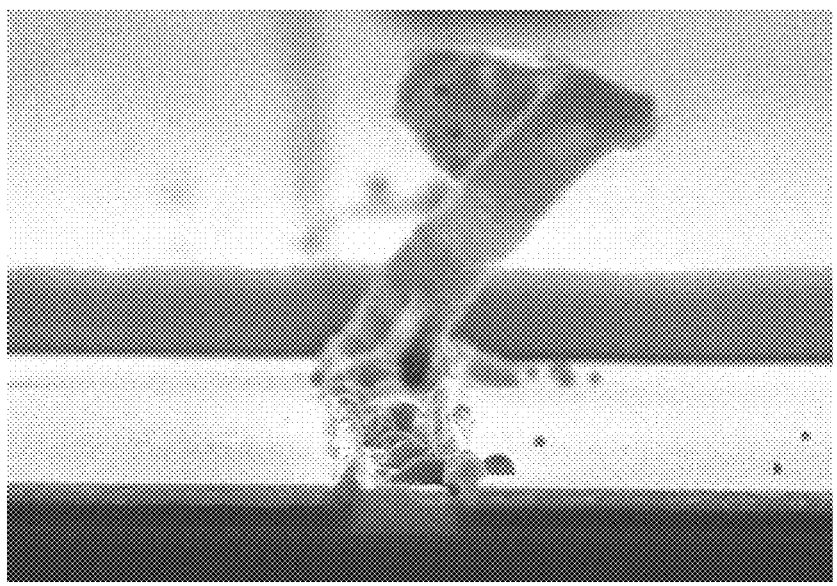
FIG. 16 is a drawing-substituting photograph showing an SEM photograph of a GaN semiconductor laser according to a related art.
Figure 17:
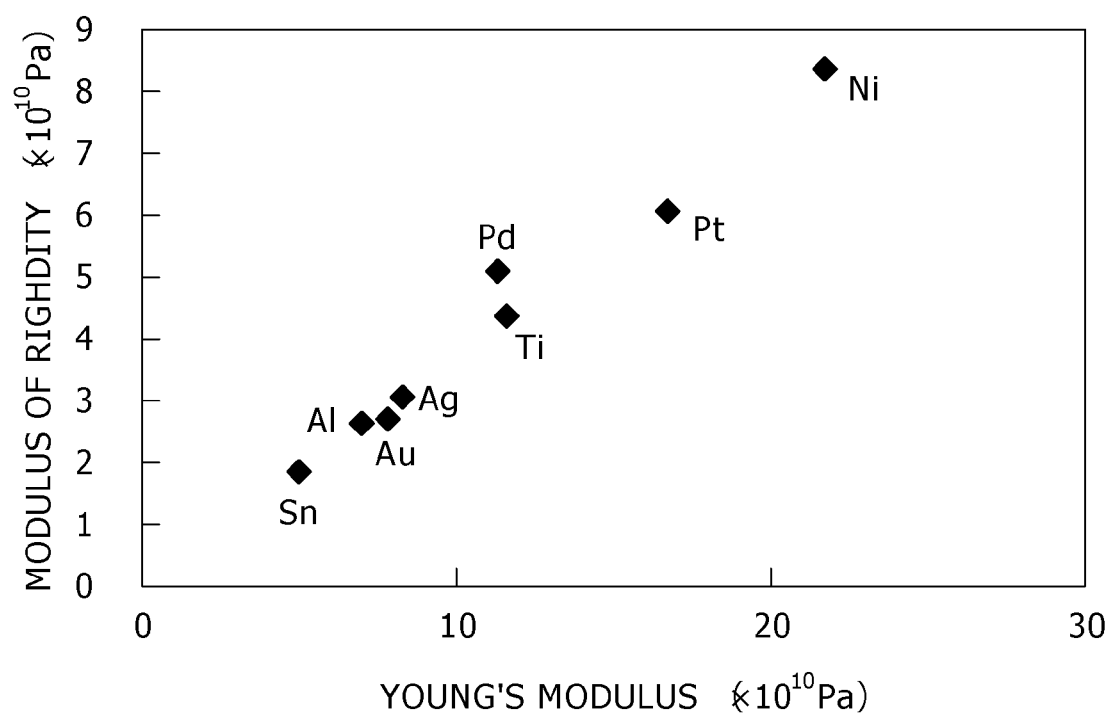
FIG. 17 is a general diagram showing the relationship between Young's modulus and modulus of rigidity, for various metals.
Figure 18:
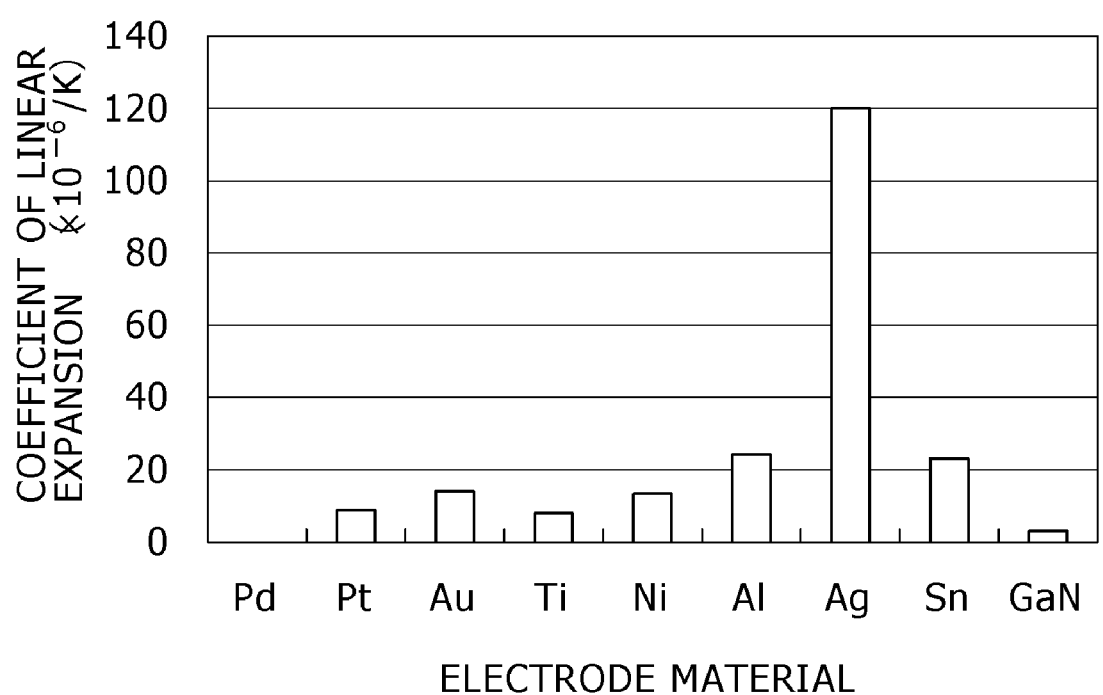
FIG. 18 is a general diagram showing coefficients of linear expansion of various metals.

A sectional TEM photograph of the part of the p-side electrode 13 and the ridge stripe 10 in the vicinity of the resonator end face in the case where the p-side electrode 13 was composed of the metallic multilayer film having five metal films of (Pd/Pt)/(Ti/Pt/Ni)=(50 nm/100 nm)/(10 nm/100 nm/100 nm) is shown in FIG. 15. As shown in FIG. 15, as above-mentioned, a trace of having been pulled at the time of cleavage was observed in the p-side electrode 13 in the vicinity of the resonator end face formed by cleavage, and a gap with a thickness of about 10 nm was observed between the p-side electrode 13 and the p-type GaN contact layer 11. In addition, as shown in FIG. 16, the p-side electrode 13 in the vicinity of the resonator end face in the case where the current was increased for obtaining a high output in the GaN semiconductor laser having this structure was mostly exfoliated and broken.

According to the second embodiment, not only the same merits as those of the first embodiment can be obtained, but also the following merits can be obtained. At least the portion, of not more than 100 μm in the resonator length direction from the resonator end face, of the p-side electrode 13 is composed of the metallic laminate film having n metal films (n is an integer of not less than 2), the total thickness of the metallic laminate film is not less than 300 nm, and the condition of $G_e \leqq 55$ GPa is satisfied, so that exfoliation or tendency toward exfoliation of the p-side electrode 13 from the p-type GaN contact layer 9 at the time of cleavage for forming the resonator end faces can be effectively prevented. Besides, even when the current passed through the GaN semiconductor laser is increased for obtaining a high output of, for example, not less than 100 mW, the exfoliation or tendency toward exfoliation of the p-side electrode 13 from the p-type GaN contact layer 9 can be prevented, and the p-side electrode 13 can be prevented from being broken. Therefore, failure of the GaN semiconductor layer due to breakage of the p-side electrode 13 can be prevented, and an enhanced reliability of the GaN semiconductor laser can be contrived.

Figure 5:
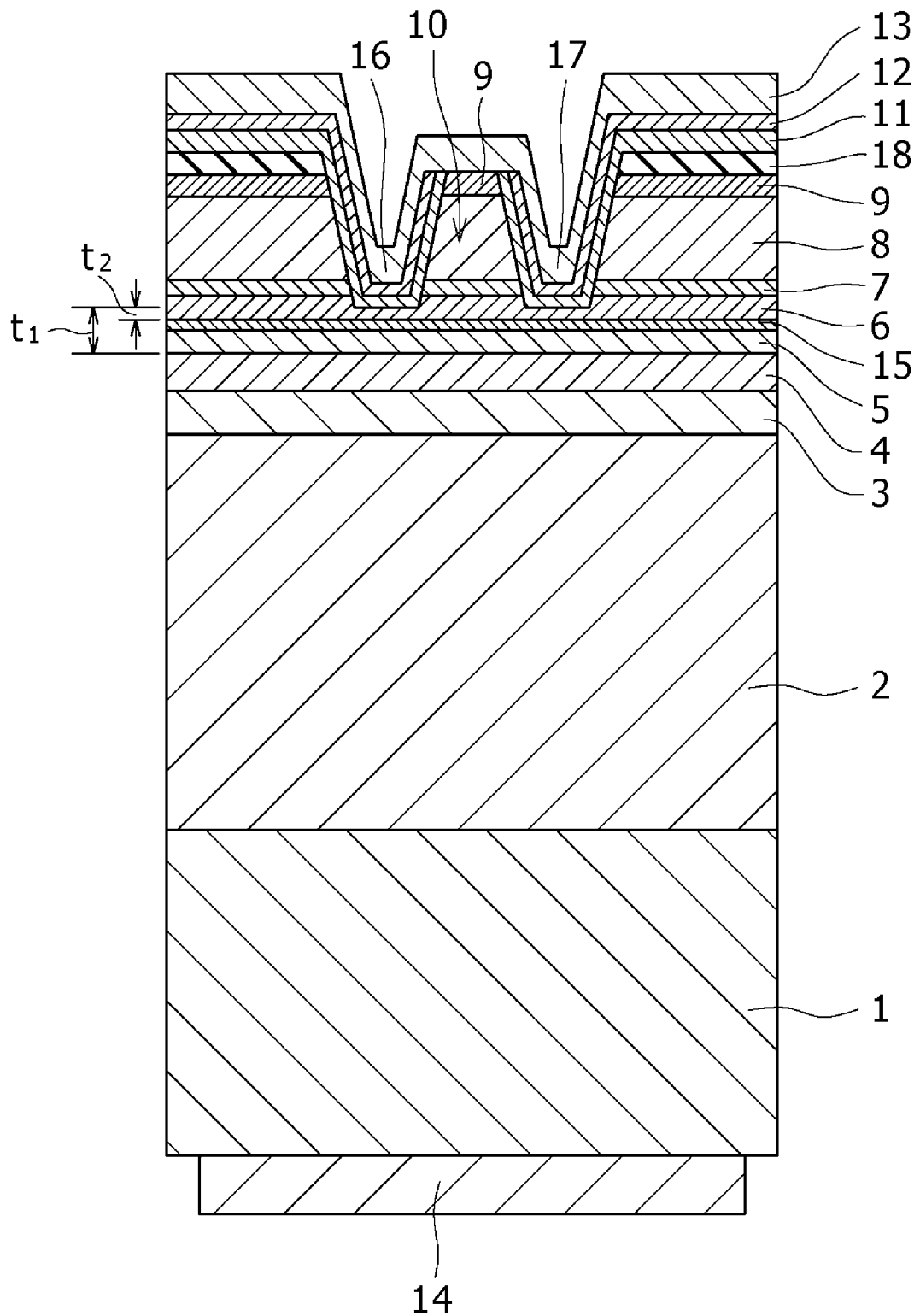
FIG. 5 is a sectional view of a GaN semiconductor laser according to a third embodiment of the present invention.

Now, a GaN semiconductor laser according to a third embodiment of the present invention will be described below. This GaN semiconductor laser is a self-pulsation type GaN semiconductor laser. FIG. 5 shows the GaN semiconductor laser.

As shown in FIG. 5, a saturable absorption layer 15 having a p-type InGaN layer sandwiched between p-type GaN layers is provided between an undoped InGaN optical waveguide layer 5 and an undoped AlGaN optical waveguide layer 6. Grooves 16 and 17 are formed on both sides of each ridge stripe 11 formed at an upper part of the undoped AlGaN optical waveguide layer 6, a p-type AlGaN electron barrier layer 7, a p-type GaN/undoped AlGaN superlattice clad layer 8, and a p-type GaN contact layer 9. An insulating film 18 such as an $SiO_2$ film is formed on the p-type GaN contact layer 9 in the areas on the outer sides of the grooves 16 and 17. Besides, an $SiO_2$ film 11 and an undoped Si film 12 thereon are formed to extend on the insulating film 18 on both side surfaces of the ridge stripe 10, the grooves 16 and 17, and the areas on the outer sides of the grooves 16, 17. A p-side electrode 13 is formed in ohmic contact with the p-type GaN contact layer 9 at the ridge stripe 10. The p-side electrode 13 is formed to extend on the undoped Si film 12 in the areas on the outer sides of the grooves 16, 17.

The other configurations of the GaN semiconductor laser than the above-mentioned are the same as those of the GaN semiconductor laser according to the first embodiment above.

The depth of the grooves 16, 17 is so set that $t_1 \geqq 105$ nm and $0 \leqq t_2 \leqq 100$ nm, where $t_1$ is the distance from the bottom surfaces of the grooves 16, 17 to the upper surface of the active layer 4, and $t_2$ is the distance from the bottom surfaces of the grooves 16, 17 to the top face of the saturable absorption layer 15, in the case of adopting a coordinate system in which one point in the bottom surfaces of the grooves 16, 17 is taken as the origin and the direction toward the active layer 4 is taken as the positive direction. The reason for this setting will be described later. Generally, $t_1 < 0.6$ μm, and typically, $t_1 < 200$ nm. The width of the grooves 16, 17 is generally not more than 250 μm, more generally not more than 100 μm, and typically not more than 20 μm.

Specific examples of the thicknesses and compositions of the GaN semiconductor layers for forming the laser structure are similar to those in the first embodiments above. More specifically, the p-type AlGaN electron barrier layer 7 has a thickness of 10 nm and an Al compositional ratio of 0.20, and the saturable absorption layer 15 has a structure in which a 2 nm-thick p-type $In_{0.02}Ga_{0.98}$ layer is sandwiched between 3 nm-thick p-type GaN layers. The p-type AlGaN electron barrier layer 7 is doped with Mg in a concentration of $1 \times 10^{19}$ cm$^{-3}$, for example. The p-type layer constituting the saturable absorption layer 15 is doped with Mg in a concentration of 5×10$^{18}$ to 1×10$^{20}$ cm$^{-3}$, for example.

In manufacturing this GaN semiconductor laser, the steps up to the formation of the p-type GaN contact layer 9 are carried out in the same manner as in the first embodiment above, then an insulating film 18 such as an SiO$_2$ film is formed on the whole surface area of the assembly being processed, and the insulating film 18 is patterned into a predetermined shape by etching. Next, by using this insulating film 18 as an etching mask, dry etching such as RIE is conducted to etch the p-type GaN contact layer 9, the p-type GaN/undoped AlGaN superlattice clad layer 8, the p-type AlGaN electron barrier layer 7, and an upper part of the undoped AlGaN optical waveguide layer 6 so as to form grooves 16 and 17, thereby forming the ridge stripe 10. Subsequently, while leaving the insulating film 18 having been used as the etching mask as it is, for example an SiO$_2$ film 11 and the undoped Si film 12 are sequentially formed over the whole surface area, then these films present in the area on the upper side of the ridge stripe 10 are selectively etched away, to expose the upper surface of the ridge stripe 10. Next, the p-type electrode 13 is formed on the ridge stripe 10 and the undoped Si film 12. Subsequently, if necessary, the n-type GaN substrate 1 is polished from the back side thereof, to reduce the thickness to a predetermined thickness.

Thereafter, cleavage and the following steps are conducted in the same manner as in the first embodiment above, to manufacture the desired GaN semiconductor laser.

In this GaN semiconductor laser, etching damages are positively introduced into the saturable absorption layer 15 including the p-type InGaN layer doped with Mg, by the dry etching conducted for forming the grooves 16 and 17, in order to shorten the carrier lifetime in the saturable absorption layer 15. In this case, the condition of $0 \leq t_2 \leq 100$ nm is satisfied as above-mentioned, in order to securely introduce the etching damages to the saturable absorption layer 15. In the saturable absorption layer 15 with the etching damages thus introduced thereto, more intermediate levels are formed, the number of non-radiative recombination processes through the intermediate levels is increased, and the non-radiative recombination lifetime is thereby shortened. In general, the carrier lifetime $\tau_s$ can be represented by the following formula:

$$1/\tau_s = 1/\tau_r + 1/\tau_{nr},$$

where $\tau_r$ is radiation recombination lifetime, and $\tau_{nr}$ is non-radiative recombination lifetime.

From this formula, it is seen that when the non-radiative recombination lifetime $\tau_{nr}$ is shortened, the carrier lifetime $\tau_s$ is also shortened.

Figure 6:
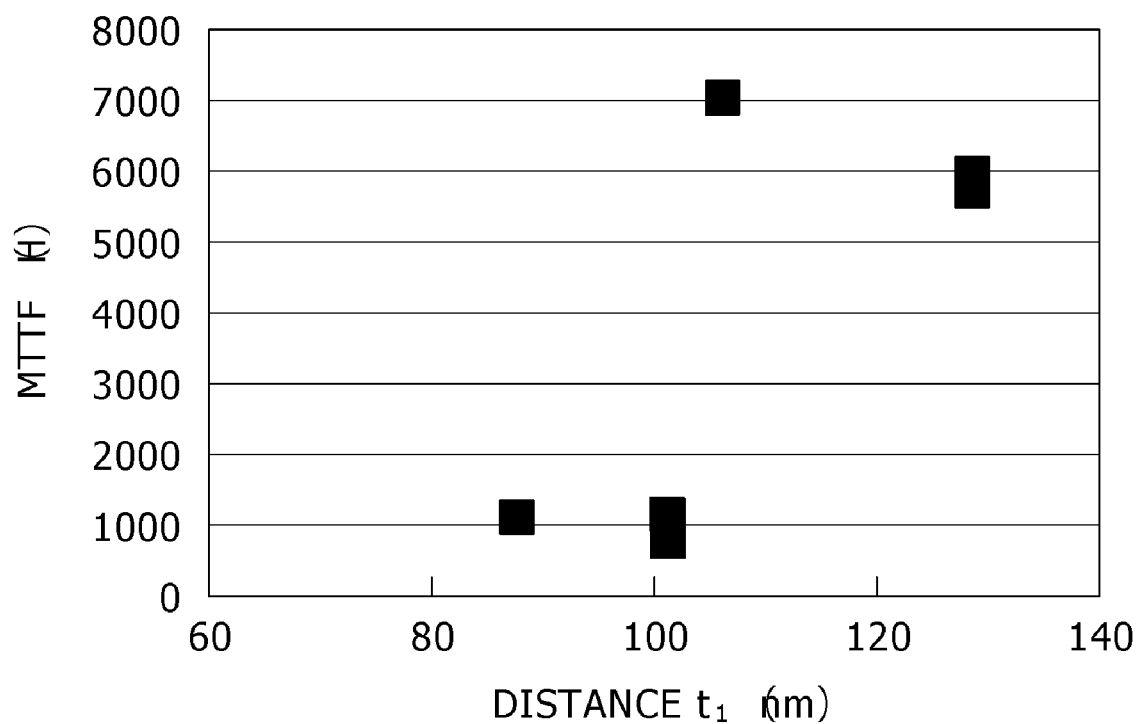
FIG. 6 is a general diagram showing the measurement results of the relationship between the distance $t_1$ from the bottom surface of a groove to an upper surface of an active layer and MTTF, for the GaN semiconductor laser according to the third embodiment of the present invention.

FIG. 6 shows the measurement results of the relationship between the distance $t_1$ and MTTF (mean time to failure) of the GaN semiconductor laser. It is to be noted here that the thicknesses and compositions of the GaN semiconductor layers constituting the laser structure in the GaN semiconductor laser and the like factors are the same as the above-mentioned specific examples. It is seen from FIG. 6 that the MTTF is shortened when $t_1 \leq 100$ nm. This arises from the fact that in the GaN semiconductor laser satisfying the condition of $t_1 \leq 100$ nm, etching damages are introduced to the active layer 4 at the time of dry etching conducted for forming the grooves 16 and 17, with the result that the lifetime is worsened sharply. Therefore, when the distance $t_2$ from the bottom surfaces of the grooves 16, 17, i.e., the dry etching processed surface to the upper surface of the saturable absorption layer 15 is so set that $t_2 \leq 100$ nm, the carrier lifetime in the saturable absorption layer 15 can be shortened, and, by satisfying the condition of $t_1 \geq 105$ nm, the MTTF of the GaN semiconductor laser can be secured sufficiently.

Besides, in this GaN semiconductor laser, in order to suppress the leakage of the electrons from the active layer 4 after being injected into the active layer 4 from the n-type AlGaN clad layer 2 side, two layers composing of the undoped AlGaN optical waveguide layer 6 having, for example, a thickness of 60 nm and an Al compositional ratio of 0.02 and the p-type AlGaN electron barrier layer 7 having, for example, a thickness of 10 nm and an Al compositional ratio of 0.20 are provided between the saturable absorption layer 15 and the active layer 4. Here, the undoped AlGaN optical waveguide layer 6, because of its being undoped, flattens the energy band in the vicinity of the active layer 4, effectively enhances the carrier barrier energy as viewed from the electrons leaking from the active layer 4, notwithstanding the low Al compositional ratio, and thereby functions to block the electrons being about to leak from the active layer 4. Further, the p-type AlGaN electron barrier layer 7 functions to block the electrons having passed through the undoped AlGaN optical waveguide layer 6. Since the electron block layer is thus formed at two stages by providing the undoped AlGaN optical waveguide layer 6 and the p-type AlGaN electron barrier layer 7, the overflow of carriers from the active layer 4 can be effectively restrained, and the number of electrons injected into the saturable absorption layer 15 due to the overflow can be reduced remarkably. Therefore, the carrier lifetime in the saturable absorption layer 15 can be shortened on an effective basis. The GaN semiconductor laser having such a configuration is high in reliability and can perform a stable self-pulsation operation.

Figure 7:
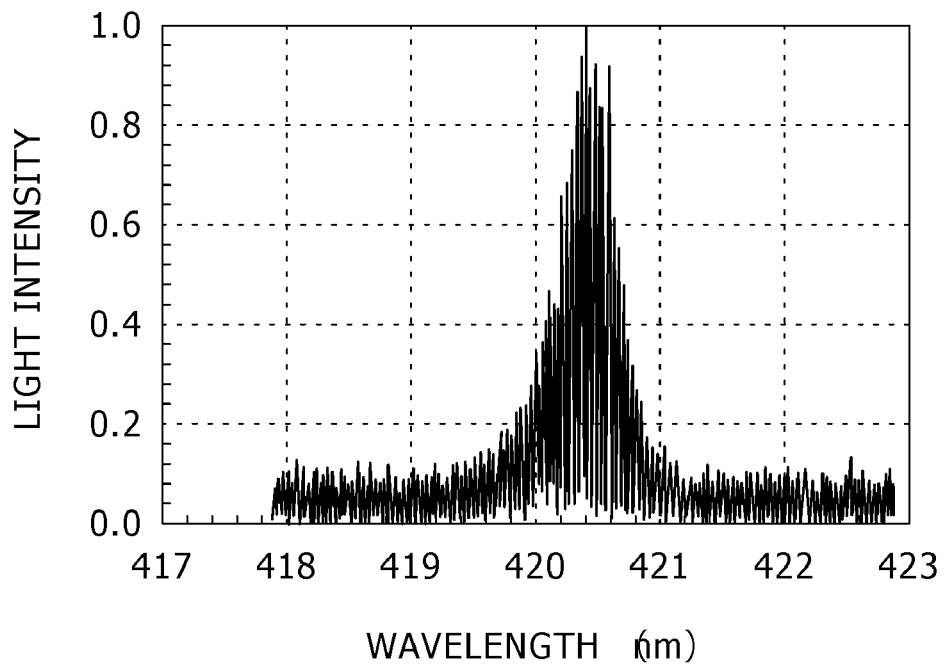
FIG. 7 is a general diagram showing the measurement results of spectrum characteristics of the GaN semiconductor laser according to the third embodiment of the present invention.
Figure 8:
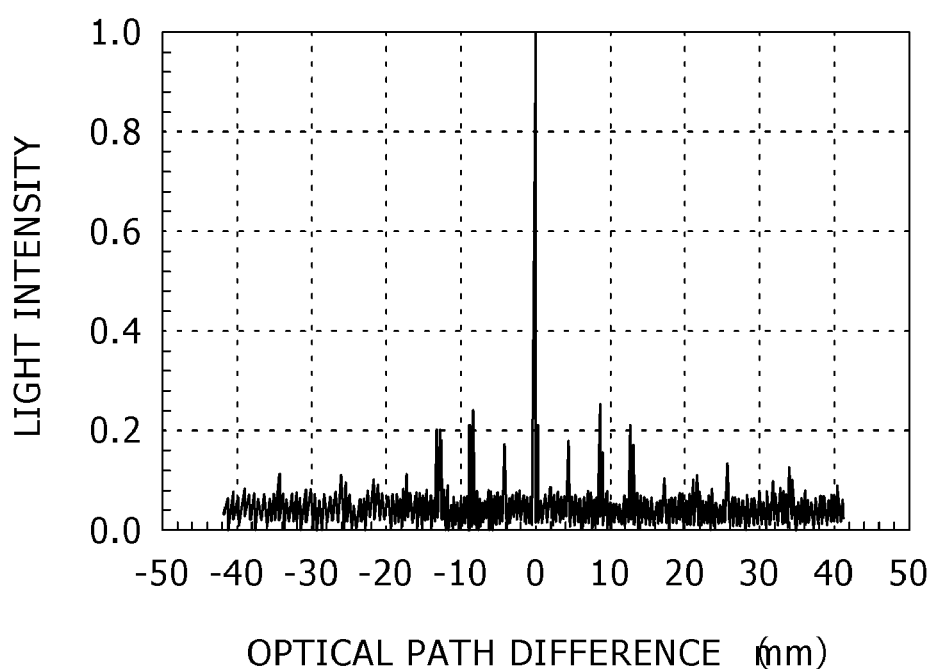
FIG. 8 is a general diagram showing the measurement results of coherent characteristics of the GaN semiconductor laser according to the third embodiment of the present invention.

FIGS. 7 and 8 shows the measurement results of spectrum characteristics and coherent characteristics of the GaN semiconductor laser. It is to be noted here that the thicknesses and compositions of the GaN semiconductor layers constituting the laser structure in the GaN semiconductor layer served to the measurements are the same as the above-mentioned specific examples, with $t_1 = 145$ nm and $t_2 = 13$ nm. In addition, the measurement of the coherent characteristics was carried out at a light output of 15 mW. Besides, $\gamma = 20\%$. As is clear from FIG. 7, multi-mode oscillation intrinsic of self-pulsation lasers is confirmed. In addition, as shown in FIG. 8, lowering of coherence ($\gamma$ characteristic) which is also intrinsic of self-pulsation lasers is confirmed.

Figure 9:
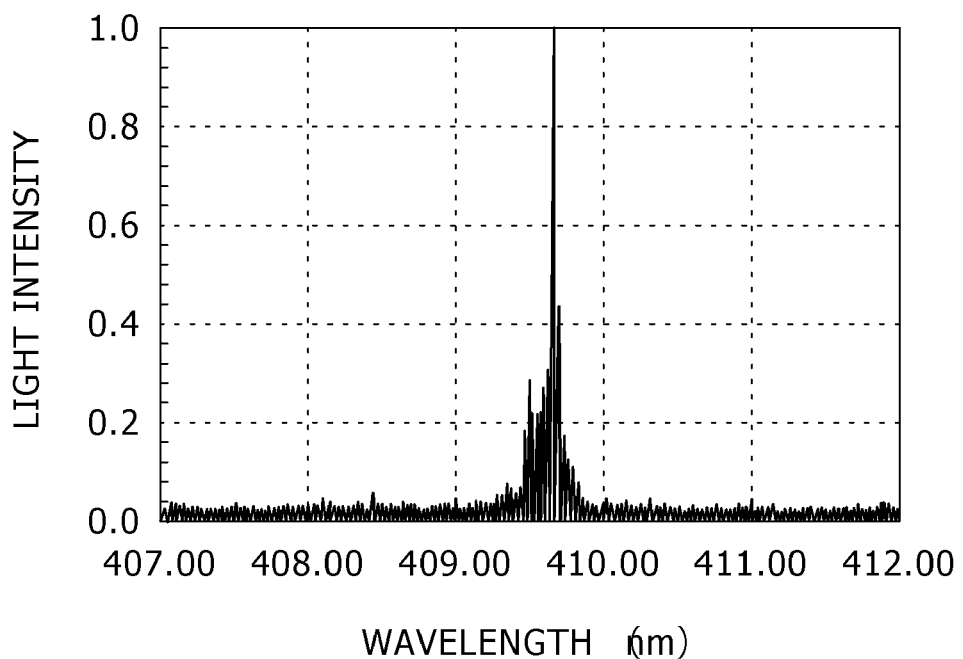
FIG. 9 is a general diagram showing the measurement results of spectrum characteristics of a GaN semiconductor laser according to a comparative example.
Figure 10:
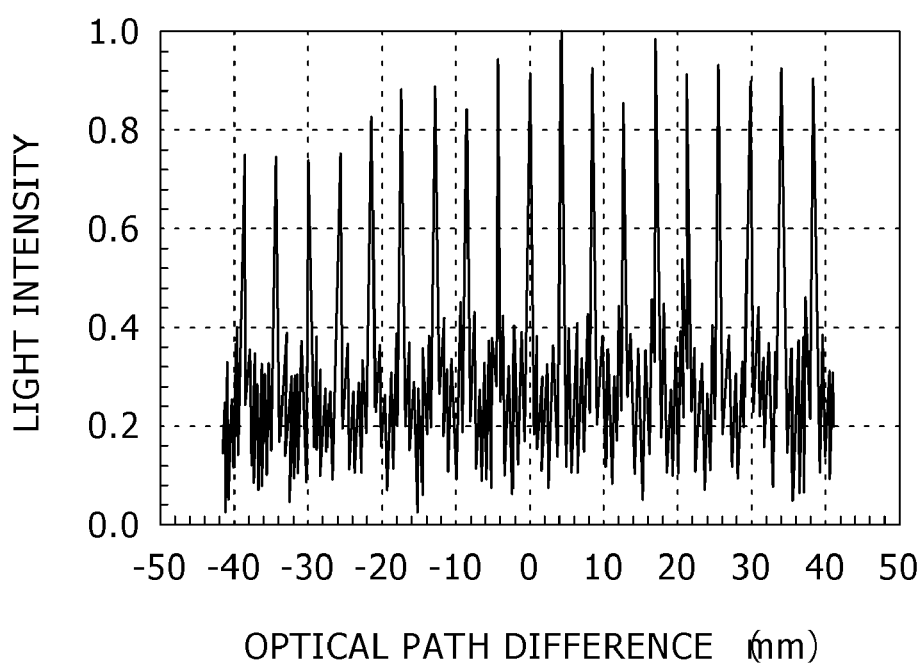
FIG. 10 is a general diagram showing the measurement results of coherent characteristics of the GaN semiconductor laser according to the comparative example.

FIGS. 9 and 10 show the measurement results of spectrum characteristics and coherent characteristics of a GaN semiconductor laser according to a comparative example. The thicknesses and compositions of the GaN semiconductor layers constituting the laser structure in the GaN semiconductor laser according to the comparative example are the same as the above-mentioned specific examples, with $t_1 = 145$ nm and $t_2 = 102$ nm; thus, $t_1$ satisfies the condition of $t_1 \geq 105$ nm, but $t_2$ does not satisfy the condition of $0 \leq t_2 \leq 100$ nm. The measurement of the coherent characteristics was carried out at a light output of 15 mW. As is clear from FIG. 9, multi-mode oscillation is confirmed, which indicates a self-pulsation operation. However, as is clear from FIG. 10, lowering of coherence ($\gamma$ characteristic) was insufficient.

According to the third embodiment, not only the same merits as those of the first embodiment can be obtained, but also the following merits can be obtained. It is possible to easily realize a GaN semiconductor laser which can perform a stable self-pulsation operation, is high in reliability, and has a long lifetime. In addition, the insulating film 18, the SiO$_2$ film 11 and the undoped Si film 12 are formed on the p-type GaN contact layer 9 in the areas on the outer sides of the grooves 16, 17. Therefore, the distance between the p-side electrode 13 and the n-side electrode 14 in the areas on the outer sides of the grooves 16, 17 can be set greater than the distance in the areas of the ridge stripe 10 and the grooves 16, 17, by the total thickness of the insulating film 18, the $SiO_2$ film 11 and the undoped Si film 12. This makes it possible to contrive a reduction in the electrostatic capacity between the p-side electrode 13 and the n-side electrode 14, to contrive enhancement of the high-frequency characteristics of the GaN semiconductor laser, and to prevent electrostatic leak or electrostatic breakdown from occurring.

Now, a GaN semiconductor laser according to a fourth embodiment of the present invention will be described below.

Figure 11:
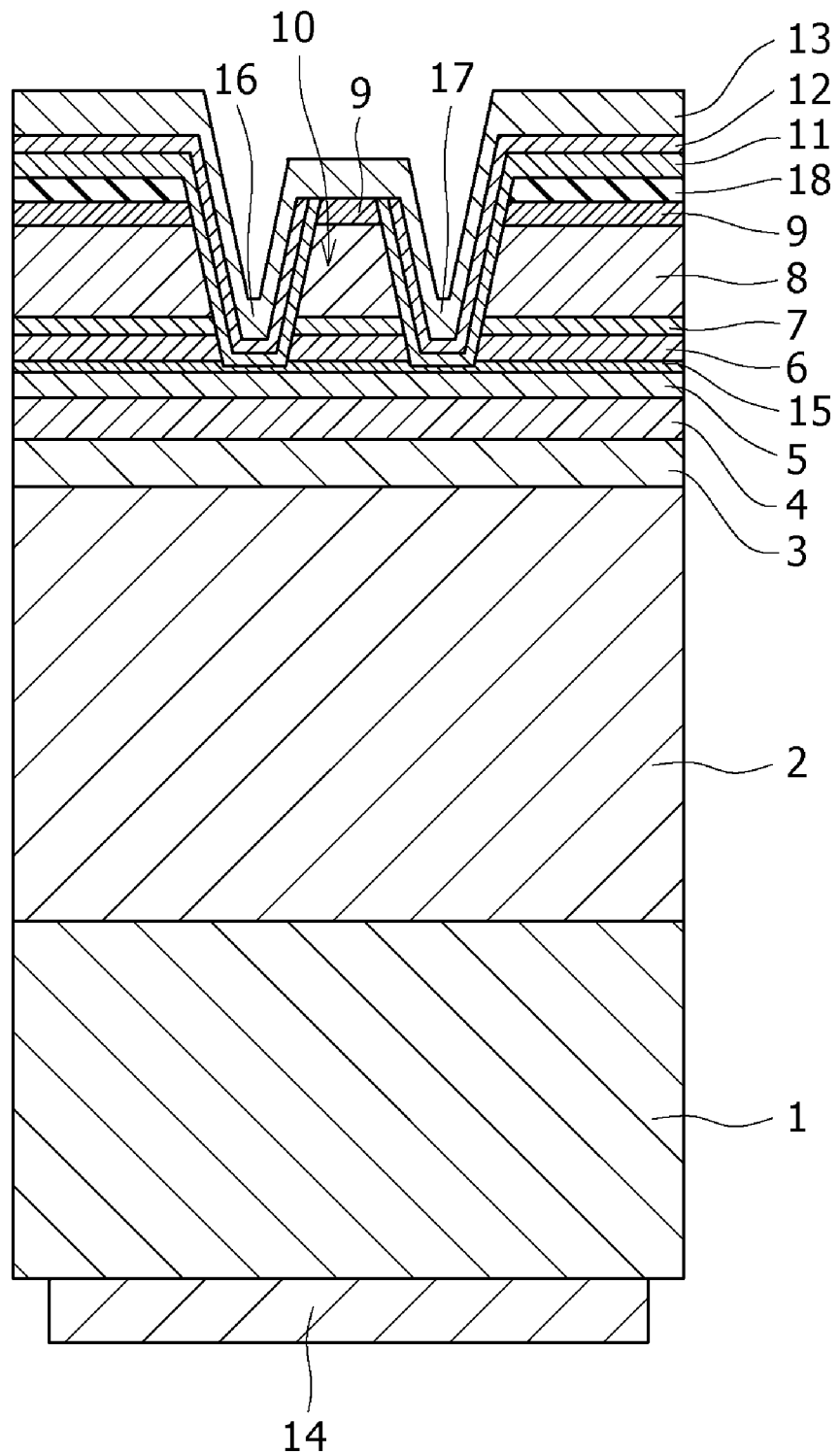
FIG. 11 is a sectional view of a GaN semiconductor laser according to a fourth embodiment of the present invention.

As shown in FIG. 11, this GaN semiconductor laser has the same configuration as that of the GaN semiconductor laser according to the third embodiment above, except that the bottom surfaces of the grooves 16 and 17 are located between the upper surface and the lower surface of the saturable absorption layer 15. In this case, etching damages are generated in the saturable absorption layer 15 in the vicinity of the bottom surfaces and lower portions of the side surfaces of the grooves 16, 17.

According to the fourth embodiment, the same merits as those of the first and third embodiments above can be obtained.

Now, a GaN semiconductor laser according to a fifth embodiment of the present invention will be described below.

Figure 12:
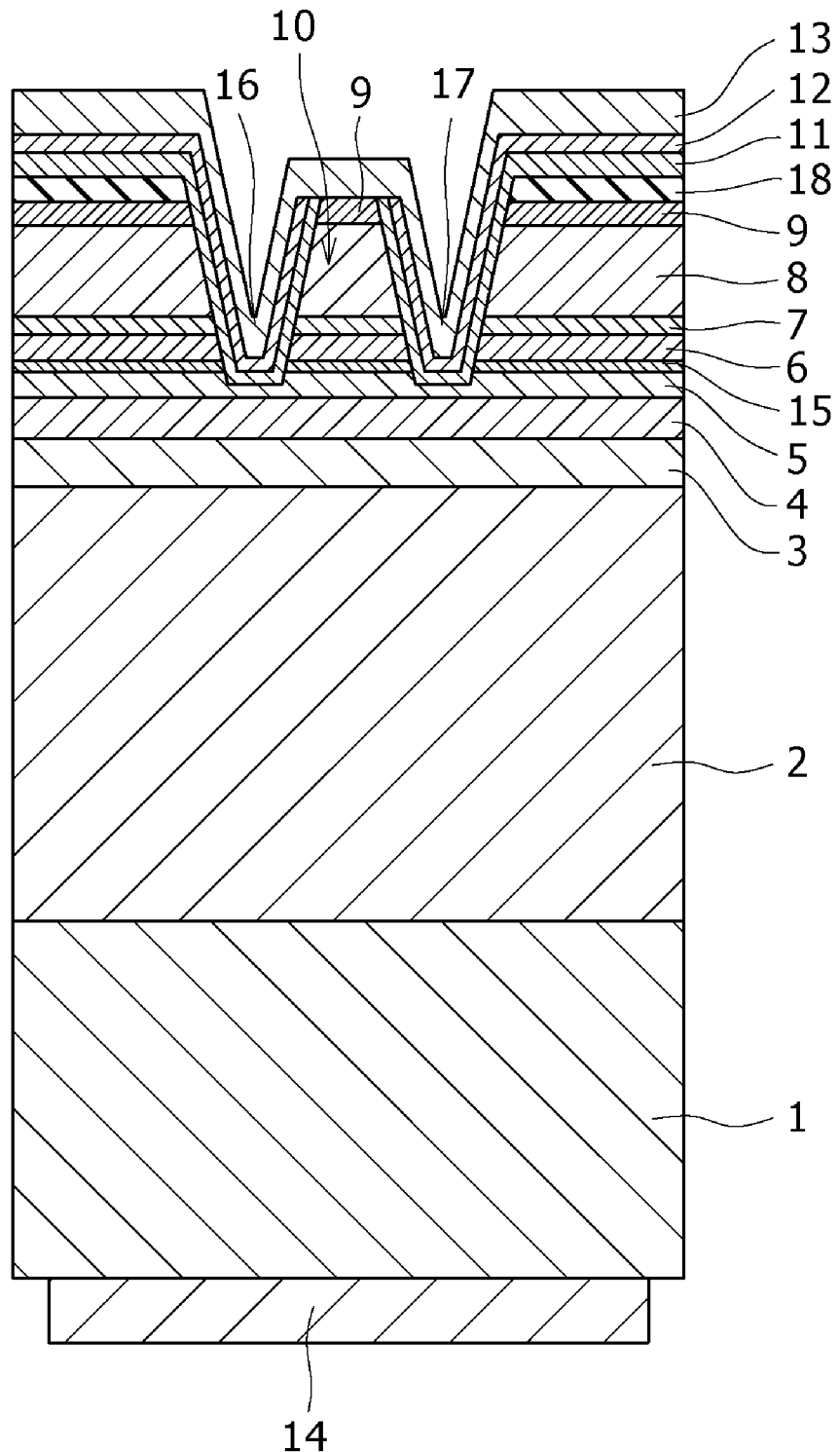
FIG. 12 is a sectional view of a GaN semiconductor laser according to a fifth embodiment of the present invention.
Figure 13:
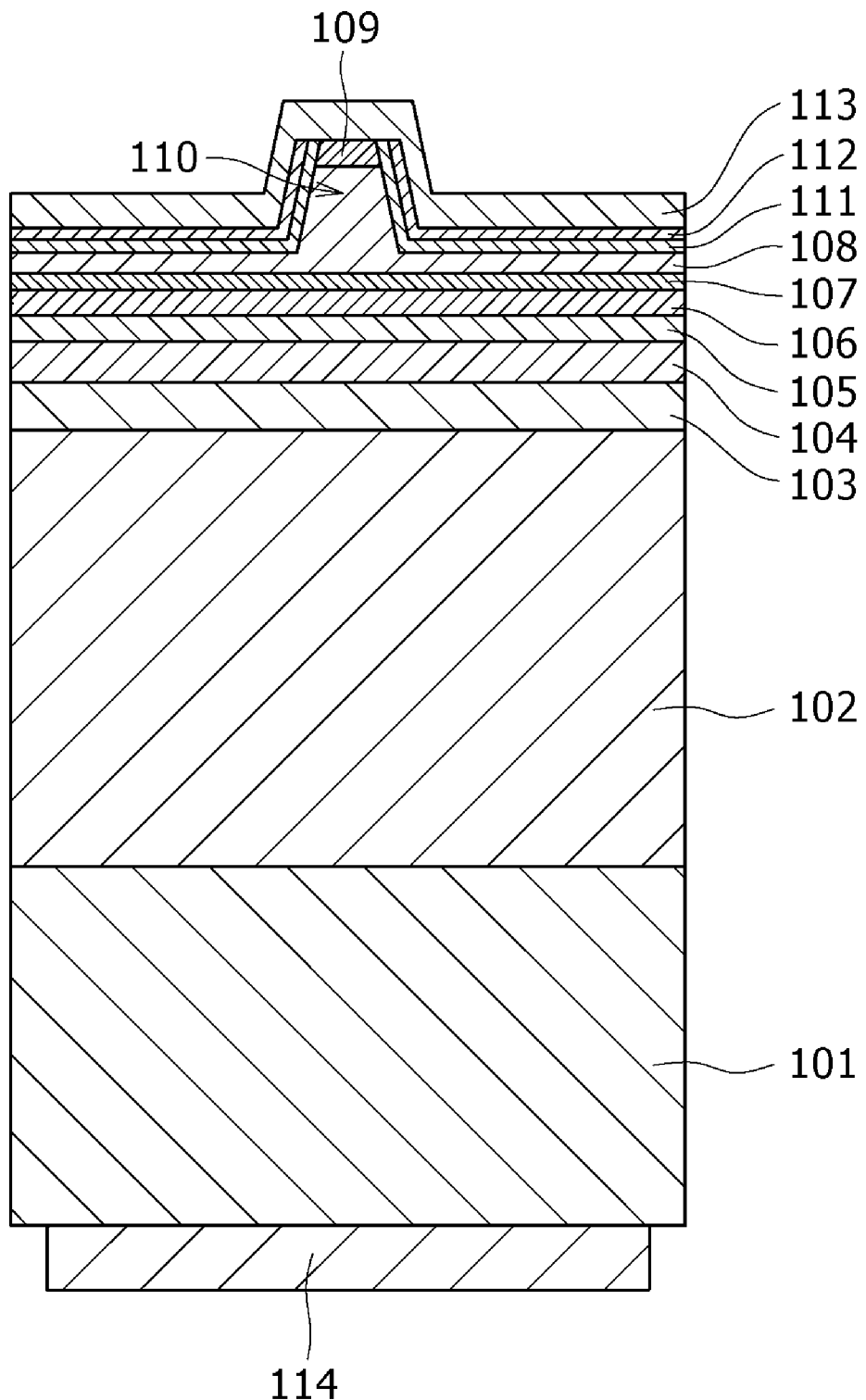
FIG. 13 is a sectional view of a GaN semiconductor laser according to a related art.
Figure 14:
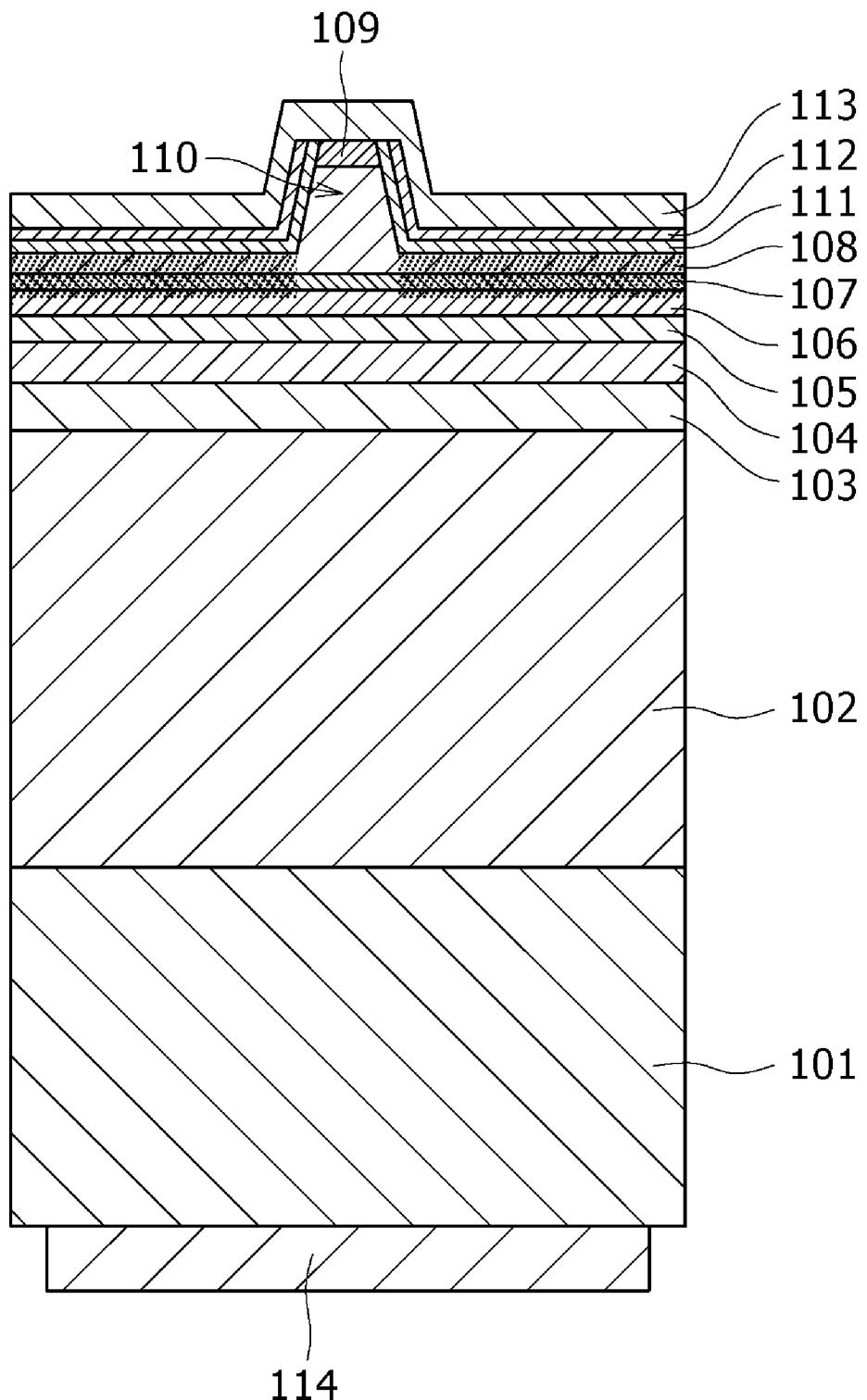
FIG. 14 is a sectional view of a GaN semiconductor laser according to a related art.

As shown in FIG. 12, this GaN semiconductor laser has the same configuration as that of the GaN semiconductor laser according to the third embodiment above, except that the bottom surfaces of the grooves 16 and 17 are located on the lower side relative to the lower surface of the saturable absorption layer 15. In this case, etching damages are generated in the saturable absorption layer 15 in the vicinity of the side surfaces of the grooves 16, 17.

According to the fifth embodiment, the same merits as those of the first and third embodiments above can be obtained.

While some embodiments of the present invention have been specifically described above, the invention is not limited to the above embodiments, and various modifications can be made based on the technical thought of the invention.

For example, the numerical values, structures, substrates, processes and the like mentioned in the embodiments above are merely examples, so that numerical values, structures, substrates, processes and the like different from the above-mentioned may also be used, as required.

In addition, if necessary, two or more of the first to fifth embodiments above may be used in combination.

Incidentally, the reduction in the carrier lifetime in the saturable absorption layer 15 can be contrived sufficiently, also by a method in which the distance $t_2$ from the bottom surfaces of the grooves 16, 17 to the upper surface of the saturable absorption layer 15 is selected to satisfy the condition of $t_2 > 105$ nm, and implantation of ions into the grooves 16, 17 is conducted so that flaws at a level similar to that of the etching damages by dry etching, for example, are generated in the saturable absorption layer 15 on the lower side of the bottom surfaces of the grooves 16, 17.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor laser using a nitride type Group III-V compound semiconductor, comprising:
   an n-side clad layer;
   an n-side optical waveguide layer over said n-side clad layer;
   an active layer over said n-side optical waveguide layer;
   a p-side optical waveguide layer over said active layer;
   an electron barrier layer having a bottom surface over said p-side optical waveguide layer; and
   a p-side clad layer over said electron barrier layer,
   wherein,
      a ridge stripe is formed by an upper part of said p-side optical waveguide layer, said electron barrier layer and said p-side clad layer,
      the ridge stripe has sidewalls with bottom edges defining a bottom surface of the ridge stripe, and
      the distance between the bottom surface of said electron barrier layer and the bottom surface of said ridge stripe in areas of said p-side optical waveguide layer on both sides of said ridge stripe is not less than 10 nm.

2. The semiconductor laser as set forth in claim 1, wherein said distance between said electron barrier layer and said bottom surface in the areas on both sides of said ridge stripe is not less than 20 nm.

3. The semiconductor laser as set forth in claim 1, wherein the distance between said bottom surface in the areas on both sides of said ridge stripe is not less than 100 nm.

4. The semiconductor laser as set forth in claim 1, wherein the distance between said electron barrier layer and said active layer is in the range of 110 to 300 nm.

5. The semiconductor laser as set forth in claim 1, wherein said p-side optical waveguide layer includes an undoped or n-type nitride type Group III-V compound semiconductor layer containing In and Ga, and an undoped or n-type nitride type Group III-V compound semiconductor layer containing Al and Ga and formed over said undoped or n-type nitride type Group III-V compound semiconductor layer containing In and Ga.

6. The semiconductor laser as set forth in claim 1, wherein said electron barrier layer includes a p-type nitride type Group III-V compound semiconductor layer containing Al and Ga.

7. An optical pickup using a semiconductor laser as a light source, said semiconductor laser comprising:
   an n-side clad layer;
   an n-side optical waveguide layer over said n-side clad layer;
   an active layer over said n-side optical waveguide layer;
   a p-side optical waveguide layer over said active layer;
   an electron barrier layer having a bottom surface over said p-side optical waveguide layer; and
   a p-side clad layer over said electron barrier layer,
   wherein
      a ridge stripe is formed by an upper part of said p-side optical waveguide layer, said electron barrier layer and said p-side clad layer,
      the ridge stripe has sidewalls with bottom edges defining a bottom surface of the ridge stripe, and the distance between the bottom surface of said electron barrier layer and the bottom surface of said ridge stripe in areas of said p-side optical waveguide layer on both sides of said ridge stripe is not less than 10 nm.

8. An optical disk system using a semiconductor laser as a light source, said semiconductor laser comprising:
   an n-side clad layer;
   an n-side optical waveguide layer over said n-side clad layer;
   an active layer over said n-side optical waveguide layer;
   a p-side optical waveguide layer over said active layer;
   an electron barrier layer having a bottom surface over said p-side optical waveguide layer; and
   a p-side clad layer over said electron barrier layer,
   wherein
      a ridge stripe is formed by an upper part of said p-side optical waveguide layer, said electron barrier layer and said p-side clad layer,
      the ridge stripe has sidewalls with bottom edges defining a bottom surface of the ridge stripe, and
      the distance between the bottom surface of said electron barrier layer and the bottom surface of said ridge stripe in areas of said p-side optical waveguide layer on both sides of said ridge stripe is not less than 10 nm.

* * * * *